(12) United States Patent
Myers et al.

(10) Patent No.: US 11,474,791 B2
(45) Date of Patent: Oct. 18, 2022

(54) METHOD AND APPARATUS FOR EFFICIENT MULTIPLICATION TO IMPROVE PERFORMANCE IN COMPUTATIONAL MACHINES

(71) Applicant: Chaoyang Semiconductor Jiangyin Technology CO. LTD., San Diego, CA (US)

(72) Inventors: Regan Myers, San Diego, CA (US); Saeid Safavi, San Diego, CA (US)

(73) Assignee: Chaoyang Semiconductor Jiangyin Technology CO. LTD., San Diego, CA (US)

( * ) Notice: Subject to any disclaimer, the term of this patent is extended or adjusted under 35 U.S.C. 154(b) by 140 days.

(21) Appl. No.: 16/790,614

(22) Filed: Feb. 13, 2020

(65) Prior Publication Data
US 2020/0387353 A1    Dec. 10, 2020

Related U.S. Application Data

(60) Provisional application No. 62/858,735, filed on Jun. 7, 2019.

(51) Int. Cl.
G06F 7/70      (2006.01)
G06F 7/523     (2006.01)
H03M 7/26      (2006.01)

(52) U.S. Cl.
CPC ............... *G06F 7/70* (2013.01); *G06F 7/523* (2013.01); *H03M 7/26* (2013.01)

(58) Field of Classification Search
CPC ............ G06N 3/0472; G06F 7/26; G06F 7/70
See application file for complete search history.

(56) References Cited

U.S. PATENT DOCUMENTS

2018/0204131 A1* 7/2018 Najafi ................. G06N 7/005
2021/0255833 A1* 8/2021 Myers ................. G06F 7/582

OTHER PUBLICATIONS

M. Yang, J. P. Hayes, D. Fan and W. Qian, "Design of accurate stochastic number generators with noisy emerging devices for stochastic computing," 2017 IEEE/ACM International Conference on Computer-Aided Design (ICCAD), 2017, pp. 638-644 (Year: 2017).*

Vahapoglu, et al., "From Stochastic to Bit Stream Computing: Accurate Implementation of Arithmetic Circuits and Applications in Neural Networks", IEEE, May 16, 2018, 12 pgs.

* cited by examiner

*Primary Examiner* — Matthew D Sandifer
(74) *Attorney, Agent, or Firm* — Jaquez Land Greenhaus & McFarland LLP; Bruce W. Greenhaus, Esq.

(57) ABSTRACT

A method and apparatus is disclosed for determining a stochastic binary string (SBS) representing a value based on the value represented in binary two's complement. Several different generators are disclosed for generating SBS strings, each being generated to have particular features that are advantageous under various conditions in which the string is to be multiplied with another SBS string. Several such generators can be presented and selected depending upon the particular values to be converted to SBS representation and the functions to be performed on those values.

13 Claims, 29 Drawing Sheets

Index $i = 1$ $A_1 = 16$ $A_0 = 4$

N

| 1 | 1 | | | | | | | | | | | | | | |
|---|---|---|---|---|---|---|---|---|---|---|---|---|---|---|---|
| $n_0$ | $n_1$ | $n_2$ | $n_3$ | $n_4$ | $n_5$ | $n_6$ | $n_7$ | $n_8$ | $n_9$ | $n_{10}$ | $n_{11}$ | $n_{12}$ | $n_{13}$ | $n_{14}$ | $n_{15}$ |

FIG. 13

METHOD AND APPARATUS FOR EFFICIENT MULTIPLICATION TO IMPROVE PERFORMANCE IN COMPUTATIONAL MACHINES

CROSS-REFERENCE TO RELATED APPLICATIONS—CLAIM OF PRIORITY

The present application claims priority to U.S. Provisional Application No. 62/858,735, filed Jun. 7, 2019, entitled "Method and Apparatus for Efficient Multiplication to Improve Performance in Computational Machines", which is herein incorporated by reference in its entirety.

BACKGROUND

(1) Technical Field

Systems and methods for improving the efficiency of computational machines and more particularly for reducing the amount of hardware necessary to perform computational operations.

(2) Background

Interest in representing numeric values as a stochastic binary string (SBS) is rising as several types of technologies are emerging that require millions and even billions of pairs of values to be multiplied. In many cases, these multiplication operations are being performed on pairs of numbers that are represented in binary format. The interest in representing the numbers to be multiplied using SBS stems from the fact that multiplication can be performed more efficiently on numbers that are represented as an SBS.

An SBS is used to represent a particular value as a series of ones and zeros. However, the value represented by the string is not dependent upon the location of the ones and zeros as is the case with values represented using binary representations. Rather, the value represented by the string is a function of the probability p that each bit within the string carries a value of either "1" or "0". That is, when constructing such a string, the choice of whether a particular bit of the string is a one or a zero is determined using a probability p that the bit will be assigned a value of one. The probability p is the same for each bit in the string. When evaluating such a string, the value of p is inferred from the ratio of "1" bits to total bits.

This can be stated as follows:
An SBS is a numerical representation of a number n in a range from floor f to ceiling c where $f \leq n \leq c$, as a string N (i.e., bit sequence) of length T (i.e., a string having T bits), where each bit has a probability p of being assigned a value of "1".
In some instances, n is a "unipolar" or unsigned representation of an integer magnitude (i.e., $f=0$, such that the magnitude is between zero and c, c being any number greater than 0).
Accordingly:
$f=0$,
$c>0$,
p is equal to n/c.
It can be shown that for an ideal unipolar SBS, the number of ones in the string divided by the total number of bits in the string will very closely approach the probability p that a particular bit in the string is a one, as the length T of the string approaches infinity.

In other instances in which n is a "bipolar" or signed representation of a magnitude (i.e., magnitude between $-c$ and c):
$f=-c$
$c>f$ and
$p=(n+c)/2c$.
For bipolar representations of values of n, where n is negative, the probability p that a bit will be assigned a value of "1" will be less than 50% and for values of n greater than zero, the probability p will be greater than 50%. When n is equal to zero, the probability that any particular bit will be a one will be exactly 50%.

Conversion from a binary representation of a value n to an SBS representation of the value n can be accomplished using a random number generator that outputs values $R_i$ uniformly distributed between $c-1$ and $-c$, inclusive. That is, there are 2c values in this range, since the range includes $-c$ and zero, but does not include c. For each bit $N_i$ of a string N, having length T, a randomly selected value $R_i$ is compared to the value n. If the value $R_i$ is less than the value n then the bit $N_i$ is assigned a value of one. Otherwise, the bit $N_i$ is assigned a value of zero.

It can be seen that (assuming the generator is sufficiently random) the probability that the randomly generated value $R_i$ will be greater than the value n is equal to the value $(n+c)/2c$; where the total number of values that can be generated is 2c, of which n+c potential values are less than n. For example, for a value of $n=0$, the number of values that are less than zero (i.e., the number of values that fall in the range of $-c$ to $-1$) out of the total set of value in the range $-c$ to $c-1$, inclusive is equal to c. Accordingly, there is a 50% probability that the bit $N_i$ will be assigned a value of one. That is, for a sufficiently long string N (i.e., T=infinity), there will be an equal number of ones and zeros in a bipolar SBS representation of the value zero.

For a value of $n=c$, there will be 2c values that are less than n (i.e., all the values from $-c$ to $c-1$, including zero). Accordingly, the probability will be 100% that the value will be less than n. That is for a string N that is an SBS representation of the value c, all of the bits $N_i$ will be assigned to a value of one. Alternatively, for a value of $n=-c$, none of the values $-c$ to $c-1$, inclusive are less than $-c$. Accordingly, there is a 0% probability that a value $R_i$ will be less than $-c$. The result is a string N that is an SBS representation of the value $-c$, in which all of the bits $N_i$ will be zeros.

Extending this to the general case, it can be seen that ideally $(n+c)/2c$ of the bits will be assigned a value of one for a string N having a total of $2c=T$ bits representing a bipolar SBS representation of a value n, where $-c<n<c$.

It should be noted that T may be an integer multiple of 2c (i.e., T=m2c, wherein m is an integer). Since the assignment of each bit of the string N is a probability, the probability that the SBS will attain the ideal condition in which the number of bits that are a one is equal to $(n+c)/2c$ is a function of the length T of the SBS. An SBS sequence consistently attains this ideal condition as the length T of the string approaches infinity.

Figures 1A, 1B, 1C:
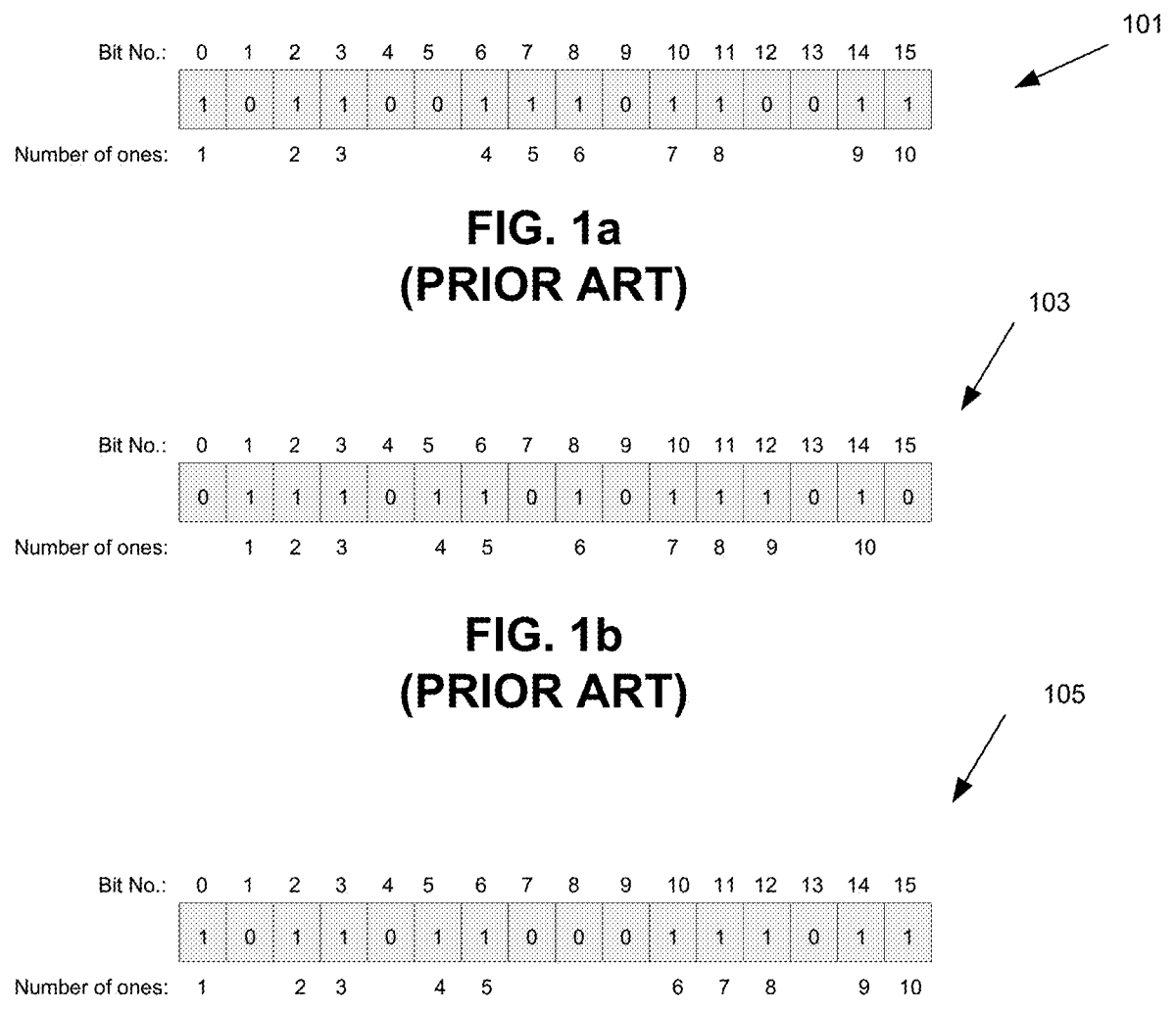

FIG. 1a through FIG. 1c illustrate an "ideal" bipolar SBS N that represents a value of 2. Each string 101, 103, 105 has a total of 16 bits. In each case, $f=-c$, $c=8$, $n=2, p=(c+n)/(2c)=10/16$. With $n=2$, the string N represents a value of 2, which can alternatively be represented by a binary value of 0010. Since $p=10/16$, there are 10 bits within the 16 bit string N that will be assigned a value of one. The strings 101, 103, 105 are each bipolar (i.e., signed) strings. That is, given sufficient number of instances of the string of length $2c=16$, the average number of bits that are assigned a value of one will be equal to c+n=10, and the probability p is equal to the number of bits that are assigned a value of one divided by the total number of bits in the string (c+n)/(2c)=p=10/16. It holds true that for a bipolar SBS (BSBS) string N of any length T, the average number of bits that are a "1" will be equal to (c+n)T/(2c) For a Unipolar SBS (USBS) string N of any length T, the average number of bits that are a "1" will be nT/c. In addition, it should be understood that the greater the length of the string T, the more likely it will be that a string N generated in the manner noted above will accurately represent the value n.

Since the strings illustrated in FIG. 1a through FIG. 1c are defined as representing a value based on a probability p that each bit will be assigned a value of "1", these illustrated strings are "ideal" strings. That is, over several instances of the string, the average number of bits that are a one will be equal to 10, but for any particular instance of the string, the number of bits may be equal to anything within the range 0 to 16. Clearly, for a BSBS sequence N that represents a value of 2, the probability that all bits will be assigned a value of "0" is relatively remote, whereas the probability is greatest that the string will have exactly 10 bits that be assigned a "1". Furthermore, the particular strings shown are merely provided as examples to illustrate the way stochastic string representations are used to represent numeric values (i.e., that the placement of the ones within the string is not relevant to the value represented by the string).

One of the reasons that representing values as a USBS is becoming more interesting is that multiplication of two values represented as a USBS can be performed by a bit-wise AND of the two USBS sequences. Multiplication of two values represented as a BSBS sequence is performed by a bit-wise XNOR of the two BSBS sequences. Therefore, a single gate (either AND for USBS or XNOR for BSBS) can be used to multiply the values represented by two strings.

It can be seen that performing a bit-wise logical AND operation results in the product of two USBS sequences, since the probability that any two particular bits, having probabilities $p_1$ and $p_2$, respectively, will both be assigned a "1" at the same time is equal to the product of the probabilities $p_1 \times p_2$. Therefore, by performing a bit-wise AND operation on a first string $N_1$ with respect to a second string $N_2$, will result in a string $N_3$ in which each bit will have a probability that is the product of the probabilities associated with the two strings. Accordingly, the resulting string $N_3$ is a string that represents the product of the values represented by the first and second strings, $N_1$, $N_2$. Similar logic can be used to show how the bit-wise XNOR of two BSBS sequences $N_1$, $N_2$ will result in a BSBS $N_3$ that represents a value that is the product of the values represented by the two strings $N_1$, $N_2$.

FIG. 2 is an illustration of a circuit (i.e., an AND gate) for multiplying two USBS sequences. The result of the bit-wise AND of these two values (10/16 times 10/16) is a string in which 7 of 16 bits are a "1". It should be noted that this is not an accurate result, since the product of 10/16×10/16 is 6.25/16.

In fact, it should be noted that the accuracy of the multiplication is not very good for smaller strings (i.e., 16 bits), since both the resolution of the string is low and the number of bits subjected to the probability p is low. However, the relative accuracy of the multiplication of two values represented by stochastic strings increases as the square root of the number of bits used in the strings. An intuitive sense for this can be gained by noting that whether each bit location carries a "1" or a "0" in each of the strings that are to be multiplied is based on a probability. Therefore, the larger the number of bits, the more likely the number of bits that are assigned a "1" will be equal to the value n. In addition, the larger the number of bits in the strings to be multiplied, the more likely the result of the multiplication operation will provide the desired result, since there will be a lower probability that the location of all of the bits assigned a value of "1" in one string will correlate with the location of all of the bits assigned a value of "1" in the other string. Similarly, there will be lower probability that the location of all of the bits assigned a value of "0" in one string will correlate with the location of all of the bits assigned a value of "0" in the other string. In fact, the probability that the bits assigned a value of "1" are aligned (i.e., that both bits at the same location are assigned a value of "1") will be approach the product of the probability $p_1$ that a bit in the first string carries a "1" and the probability $p_2$ that a bit in the second string carries a "1" as the length approaches infinity. Therefore, the longer the strings to be multiplied, the greater the likelihood that the number of bits assigned a value of "1" will be equal to the product of the probabilities $p_1$, $p_2$. In addition to that, USNR strings that represent a value closer to c/2, rather than values close to either 0 or c will have a higher probability of being accurate. That is because the result will be inaccurate for cases in which the bits of the strings are either completely correlated or completely uncorrelated (i.e., either all of the "1"s of one string are aligned with the "1"s of the other string, or none of the "1"s of one string are aligned with the "1"s of the other string). Viewed from another angle, when the values are at one extreme or the other, the probability of a bit being assigned a value of "1" is either very high or very low. Such cases will require a longer string to ensure that the low probability events occur sufficient often to provide an accurate result. For example, for a string representing a value where the probability of a bit being assigned a value of "1" is very high, it may take a very large number of bits before a bit occurs that is not assigned a value of "1". Similarly, for a string in which the probability of a bit not being assigned a value of "1" is very low, it may take a very large number of bits before a bit occurs that carries a "1". Clearly, for the extreme cases, it can be intuitively understood that the strings will have to be larger to attain the same accuracy that is attained for strings in which the probability of a bit being assigned a value of "1" is closer to 0.50 (i.e., 50%). USBS sequences that represent a value closer to c/2, rather than values close to either 0 or c will have a lower probability of being accurate.

In the case shown in FIG. 2, both values to be multiplied have 10 bits that are assigned a value of "1". Ideally, 6 of the bits of the first value that are assigned a value of "1" would align with a bit of the second value that also carries a "1". However, since 7 (rather than 6, or more precisely, 6.25) of the bits are assigned a value of "1" in the first string are aligned with a bit of the second string that is a one, the product of the two numbers is inaccurate. As noted above, longer strings result in a more accurate product of the two strings, as the probability that the ideal number of bits would align increases.

Figures 3A, 3B:
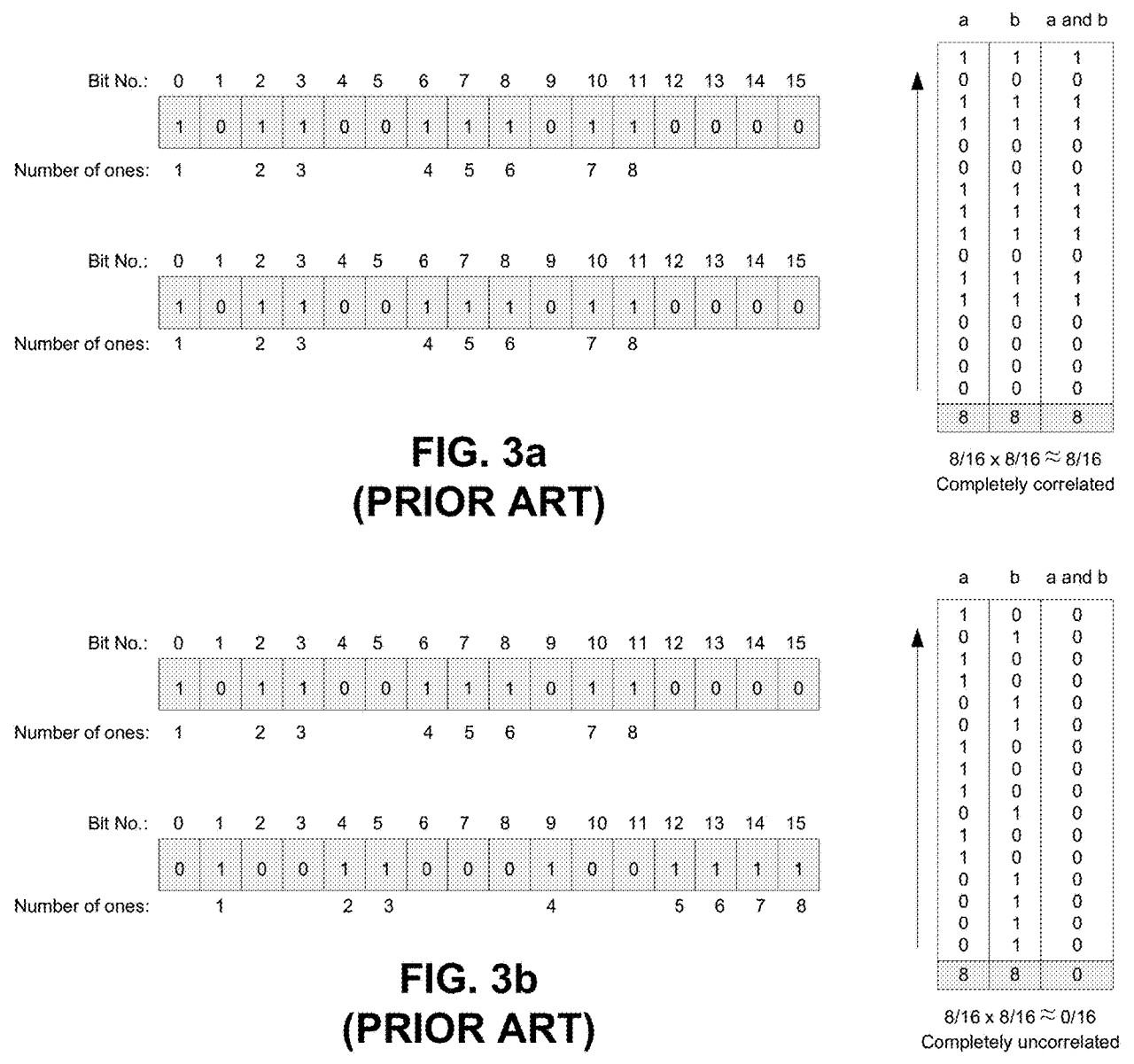

FIG. 3a is an illustration of two USBS sequences that are completely correlated. A bit-wise AND of these two strings results in a string with 10 of the 16 bits in the result being assigned a value of "1". The result of multiplying 8/16×8/16 where the two strings are completely correlated is 8/16. Clearly, this is far from an accurate result. Note that any other relationship between the location of the "1" of each string would result in a product that is closer to the accurate product, which is a value of 4/16.

FIG. 3b is an illustration of two USBS sequences that are completely uncorrelated. Here again, the product of the two anticorrelated values results in an answer that is equally as bad as the case in which the "1"s are completely correlated. That is, the result of 8/16×8/16 is 0 for two strings that are completely anticorrelated. Again, any other relationship between the locations of the "1"s would result in a product that is closer to the correct answer (with the exception of the completely correlated relationship noted above, in which the answer is in error by an equal magnitude).

The idea with the stochastic computations is that probabilistically, the number of times that the locations of the ones and zeros used to represent the two values to be multiplied are either correlated or anticorrelated will be small with respect to the number of times the locations of only half the bits of the same value are aligned (i.e., locations of bit in each value are uncorrelated). The longer the strings that are being multiplied, the lower the probability that the strings will be either completely correlated or completely anticorrelated.

FIG. 4 is an illustration of two USBS sequences in which half the bits are assigned a value of "1" are correlated with bits of the other string that are assigned a value of "1" (i.e., "uncorrelated"). In this case, the result of the multiplication is accurate. That is 8/16×8/16 is equal to 4/16.

Whereas unsigned representations (i.e., USBS sequences) are multiplied using an AND gate, signed representations (BSBS sequences) are multiplied using an XNOR gate. As noted above, for a BSBS, p=(n+c)/2c. Therefore, if n (the number to be represented) is equal to zero, the probability that a bit will be assigned a value of "1" is:

$$p=(0+c)/2c=c/2c=1/2=0.50 (\text{i.e., } 50\%).$$

Therefore, ideally, half the bits will be assigned a value of "1" when the string represents a value of zero. For example, for a string of length 16 in which 8 of the bits are assigned a value of "1", the probability is 50% (i.e., 0.50), where n=0, c=16, p=(n+c)/2c=(0+16)/2(16)=0.50.

FIG. 5 is an illustration of an XNOR gate used to multiply two BSBS sequences. Each string has a length c=16, a representative value n=0, and a probability that a bit will be assigned a value of "1", p=0.50. In the example shown, the result is a string having 8 bits that are assigned a "1". This result represents a value of 0. Accordingly, the result of the multiplication 0×0=0 is correct. In this case, it can be seen that the bits that are assigned a value of "1" in each string are uncorrelated.

Figures 6A, 6B:
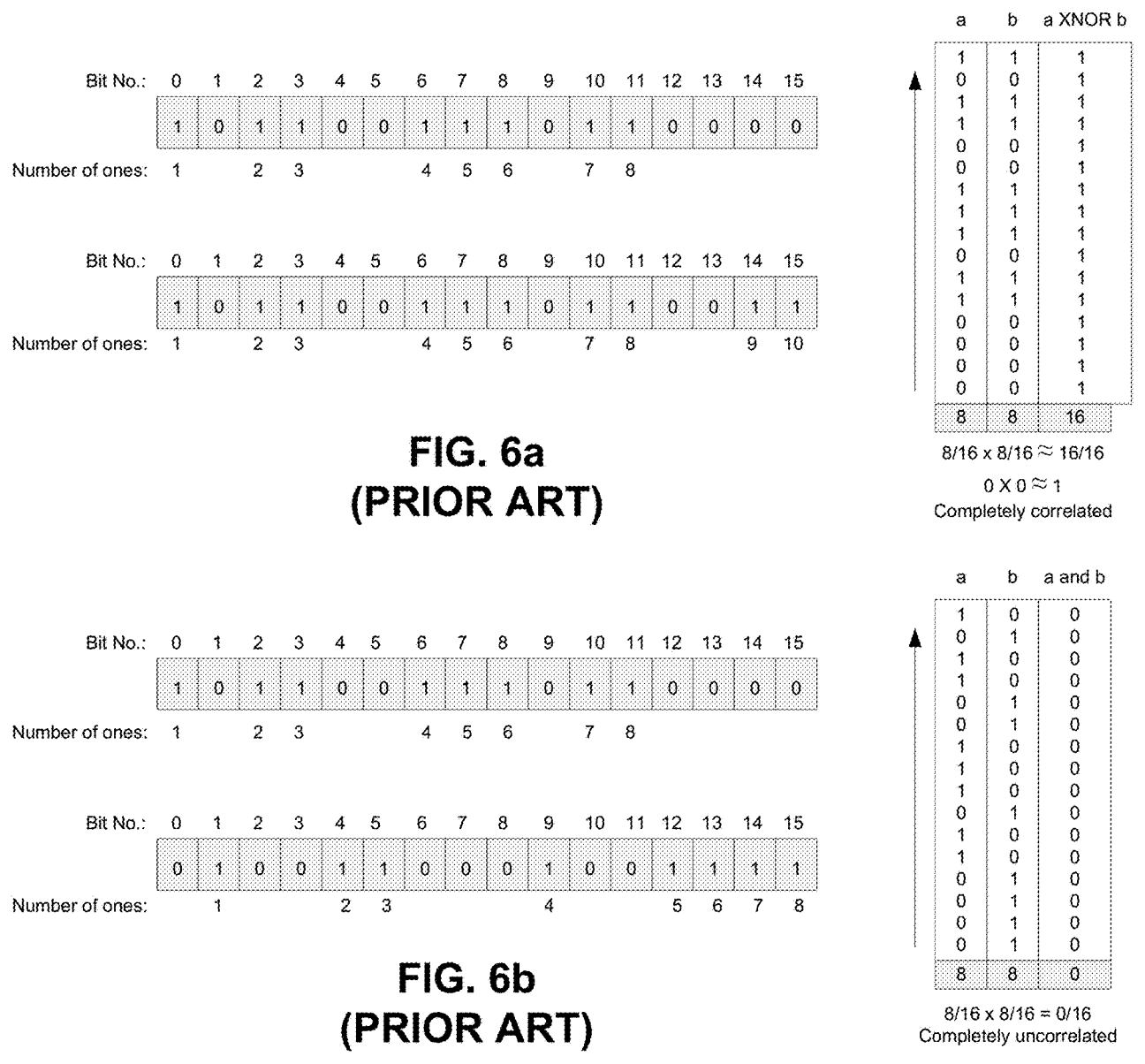

FIG. 6a is an illustration of a case in which two strings representing values of 0 are completely correlated. In this case, the result is a string that represents a value of 1. Clearly, this is an incorrect answer, resulting from the fact that the string are completely correlated.

FIG. 6b is an illustration of a case in which the two strings representing values of 0 are completely anticorrelated. In this case, the result is a string representing a value of −1. Again, it can be seen that, just as is the case when the strings are completely correlated, the answer is wrong when the strings are completely anticorrelated.

While strings can be multiplied with a very high level of efficiency (i.e., using very little hardware), the size of the string needed to represent the values to be multiplied are very large. That is, in order to represent a value of $10^7$, you need $10^7$ bits, as opposed to binary representation which only requires 20 bits. Therefore, storing such values is extremely inefficient for large values. The larger the value, the more inefficient the representation becomes.

Nonetheless, the multiplication of values represented in binary form is relatively difficult and requires far more hardware than multiplication of values represented in stochastic form. Furthermore, multiplication operations on SBS sequences can be performed very quickly by having a number of multiplication gates operating in parallel. Note that the particular order of the bits of each stream are not relevant, since the placement of the ones and zeros throughout the strings is arbitrary. Therefore, as long as the timing of the bits entering the multiplication gate is synchronized, it does not matter what order the bits of the strings enter the gates, subject to the correlation requirements of the two strings, as noted above.

FIG. 7 is a simplified schematic of a design of an SBS generator such as the one described above that can be used to generate an SBS sequence having a value that is determined by a stored binary value. This method for generating an SBS sequence is referred to herein as a "ρ-sequence method" (i.e., the Greek letter rho, referring to the fact that the sequence is derived using a random sequence of values). A pseudo random number generator (PRNG) 701 outputs a stream of randomly generated binary values. The generator 701 is call a "pseudo" random number generator because the stream of values output from the PRNG 701 is periodic over a relatively long period. That is, the sequence of values will repeat, but only after a very large number of values has been output. Accordingly, the values are deterministic (the next value can be determined from a give set of previous values). However, a PRNG is simpler and the period over which the sequence is spread is relatively long making it viable to use the PRNG rather than the more expensive true random number generator. Therefore, for all relevant intents and purposes, the sequence generated using either the PRNG or the true random number generator can be considered random. Nonetheless, while a PRNG is less expense, a true random number generator may be used in some embodiments. It should be noted that at each instance through this disclosure in which a PRNG is disclosed, a true random number generator could be used, even though a true random number generator is typically more complex and expensive than a PRNG.

The output of the PRNG 701 is coupled to a first input to a comparator 703. The second input to the comparator 703 is coupled to the output of a memory 705 that provides a binary value to the comparator 703. The number of bits used to represent the binary value output from the PRNG 701 is equal to the number of bits used to represent the binary value output from the memory 705. If the binary value output from the memory 705 is greater than the random value output from the PRNG 701, then the comparator outputs a "1". Otherwise, the comparator outputs a "0". The binary value output from the memory remains constant as a sequence of values output from the PRNG 701 is applied to the comparator 703, until the number of random values is equal to the number of bits to be contained in the SBS to be generated to represent the binary value. The length of the SBS will determine the relative accuracy of the representation. The longer the string of bits in the SBS used to represent value, the more accurate the representation will be. Furthermore, the length of the SBS determines the resolution with which the SBS can determine the value. It should be clear that the maximum resolution is determined by the length of the binary value output from the memory 705 and the PRNG 701.

For example, if the memory outputs a binary value represented in 4 bits, then the range of values will be limited to 0-15. Naturally, this can be shifted, so that the output represents values from −7 to 8, for example, as would be the case if the values are signed binary values. Similarly, the output of the PRNG 701 would be a stream of 4-bit words. Since the stream of words output from the PRNG 701 is random, at least for a stream that is shorter than the period of the PRNG 701, the probability that the output of the PRNG 701 is greater than the value output from the memory 705 will be determined by the magnitude of the value output from the memory 705. Accordingly, each bit generated by the comparator 703 has a probability of being a "1" that is equal to the value of the binary word output from the memory 705.

There are problems that can arise when using SBS sequences generated using the ρ-sequence method. These problems stem from the fact that the SBS sequences generated using the ρ-sequence method have values that are not typically accurate representations of the value that they are intended to represent. That is, SBS sequences generated by the ρ-sequence method have a binomial error distribution with a scaled deviation proportional to:

$$\sqrt{p\left(\frac{(1-p)}{T}\right)} \quad \text{Eq. 1}$$

In addition, the fact that a PRNG is required is not ideal. Furthermore, SBS sequences generated using the ρ-sequence method do not adhere to the additive inverse identity property. That is, an SBS ρ(−b) that is generated to represent a value −b is not equal to the SBS −ρ(b). Accordingly, ρ(−b)−(ρ(b)) is not equal to zero. This can be a problem in some cases in which it would otherwise be desirable to use SBS sequences. It should be noted that changing the polarity of a number typically can be done by inverting each bit of the binary stream representing that number.

Currently, neural networks and other AI engines are being used to perform an increasing number of tasks. Such neural networks and AI engines require millions of multiplication operations to be performed in order to perform the desired task.

Therefore, finding a way to perform multiplication with less hardware yields a significant advantage in terms of the size of the multiplication hardware, and thus the cost of the multiplication hardware. However, use of ρ-sequences to generate SBS sequences is not ideal due to the need for a PRNG and the lack of adherence to the additive inverse identity property. Furthermore, it would be beneficial to identify ways to make the results from such SBS multiplication operations more accurate for use with neural networks and other AI engines. The presently disclosed method and apparatus provides a method and apparatus that improves the performance of SBS sequences for use in such situations.

DESCRIPTION OF THE DRAWINGS

FIG. 1*a* through FIG. 1*c* illustrate an "ideal" bipolar SBS N that represents a value of 2.

FIG. 3*a* is an illustration of two USBS sequences that are completely correlated.

FIG. 3*b* is an illustration of two USBS sequences that are completely uncorrelated.

FIG. 6*a* is an illustration of a case in which two strings representing values of 0 are completely correlated.

FIG. 6*b* is an illustration of a case in which the two strings representing values of 0 are completely anticorrelated.

FIG. 13 is a graphical representation of the value of the accumulator A after STEP 1009 of FIG. 10 has been performed.

Like reference numbers and designations in the various drawings indicate like elements.

DETAILED DESCRIPTION

Some embodiments of the disclosed method and apparatus use several types of stochastic binary string (SBS) generators to generate SBS sequences based on the particular values to be multiplied.

One such SBS generator generates an ω-sequence. An ω-sequence is a string that presents a numerical value in SBS format. An ω-sequence may be either a binary SBS (BSBS) or a unipolar SBS (USBS). The ω-sequence may be used either once or repeated multiple times within an SBS sequence. Within each ω-sequence, the number of transitions from "1" to "0" is minimized by grouping the 1-bits together and grouping the 0-bits together. Accordingly, the output of an ω-sequence generator is a string of is followed by a string of 0s. The number of ones in the first part of the string will be equal to pT, the product of the probability associated with each bit of the SBS sequence N and the length T of the SBS sequence. In general, the probability p that a bit of a BSBS sequence is assigned a value of "1" is determined as a function of a value n being represented by the SBS sequence. For a BSBS, the probability $p=(c+n)/2c$, and the BSBS sequence N can represent values n in a range from $-c$ to $c$. For a USBS, the probability is $p=n/c$. and the sequence N can represent values n in a range from f to c, where $f \leq n \leq c$.

Conversion of a value b represented in binary form to a value n represented by an either a USBS or a BSBS sequence N using an ω-sequence can be performed as follows. For a USBS sequence, the probability is $p=c/n$, where c is the ceiling (i.e., largest number that can be represented by the USBS). For a BSBS, the probability p can be expressed as $(2^{L-1}+b)/2^L$, where L is bit precision in the binary representation and b is the value represented in binary form. The bit precision of the binary representation is the length of the binary number (i.e., number of bits) used to represent the value. The probability p can be used to determine the number of bits that are assigned a value of "1" within the ω-sequence. That is, the number of ones in the ω-sequence is equal to pT. In one embodiment, the value pT is compared to the output of a counter that runs from 0 to T. If the value pT is larger than the output of the counter, a "1" is generated within the ω-sequence; otherwise a zero is generated. Once the counter runs the full range from 0 to T, a complete ω-sequence is generated in which the value b is represented in SBS format as a string of pT bits followed by a string of T(1−p) bits assigned a value of zero. An example is provided below to illustrate this.

Figure 2:
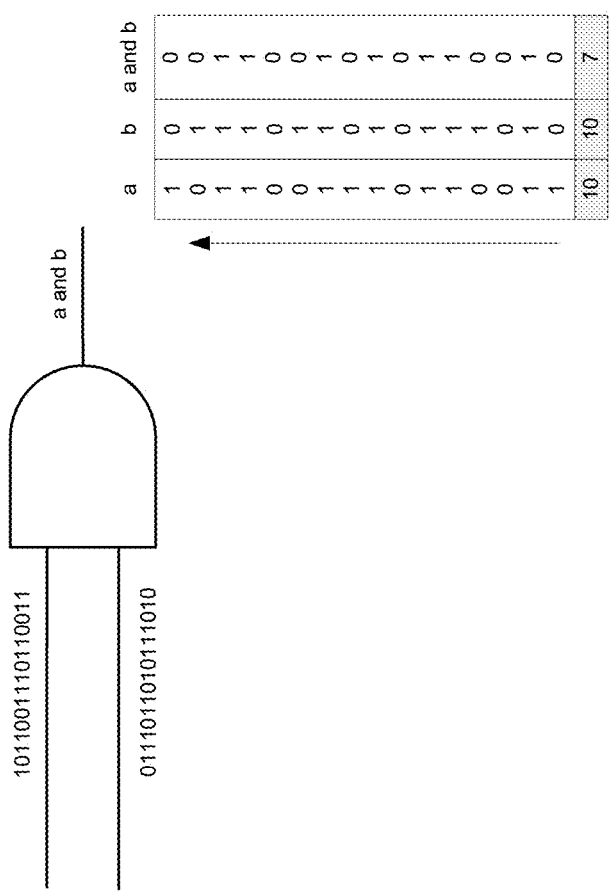
FIG. 2 is an illustration of a circuit (i.e., an AND gate) for multiplying two USBS sequences.
Figure 4:
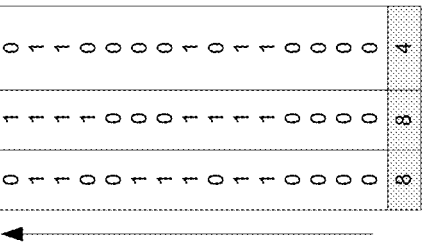
FIG. 4 is an illustration of two USBS sequences in which half the bits are assigned a value of "1" are correlated with bits of the other string that are assigned a value of "1".
Figure 5:
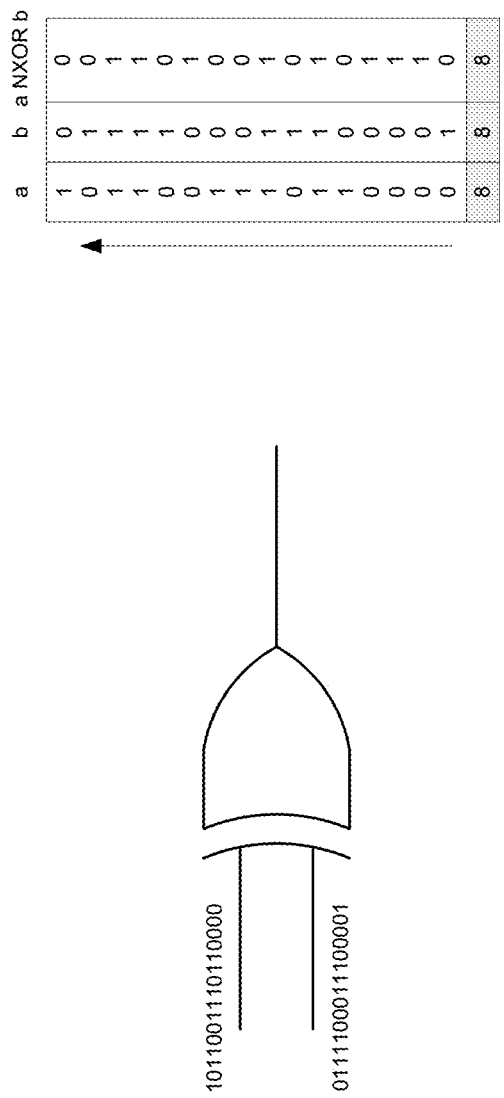
FIG. 5 is an illustration of an XNOR gate used to multiply two BSBS sequences.
Figure 7:
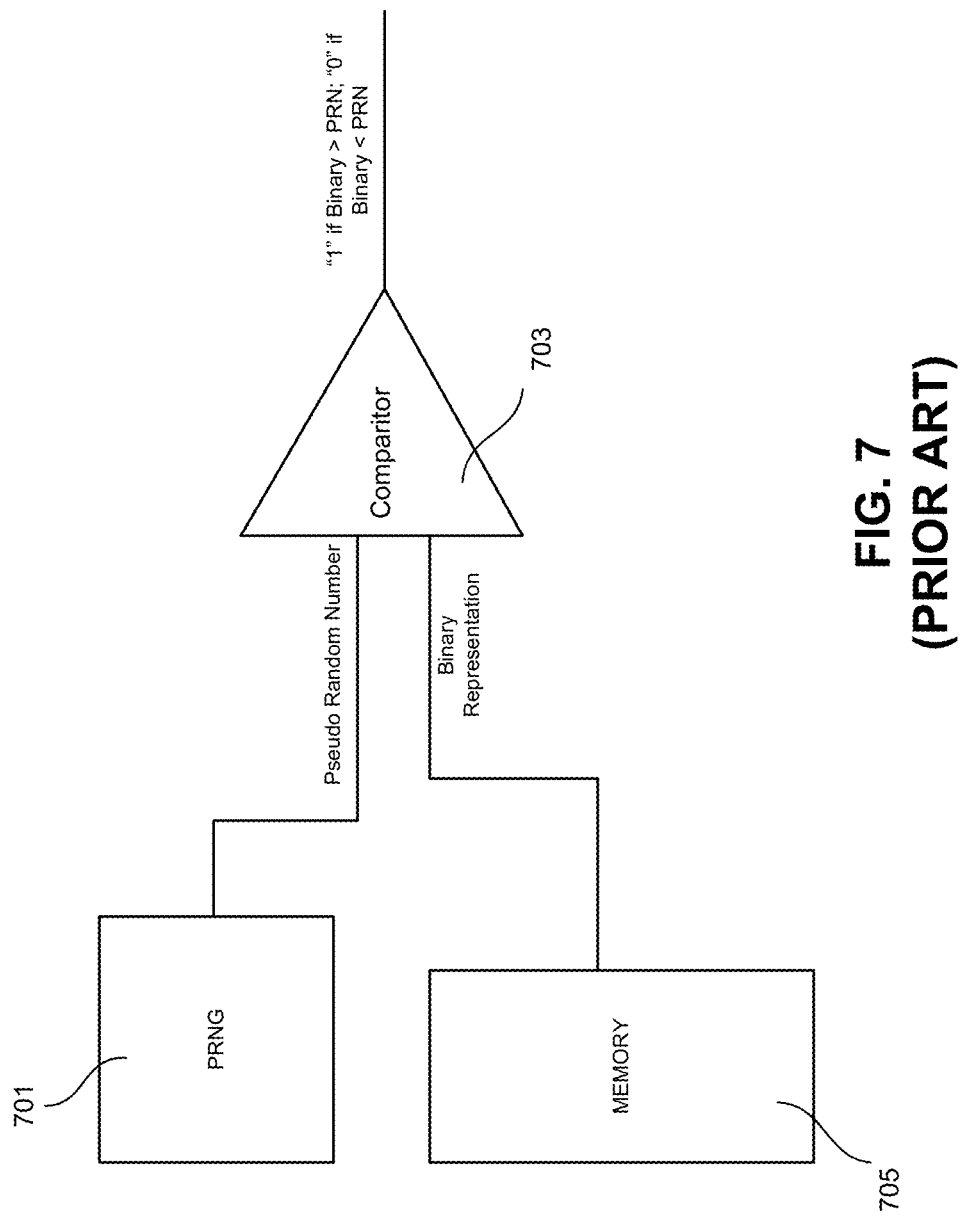
FIG. 7 is a simplified schematic of a design of an SBS generator such as the one described above that can be used to generate an SBS sequence having a value that is determined by a stored binary value.
Figure 8:
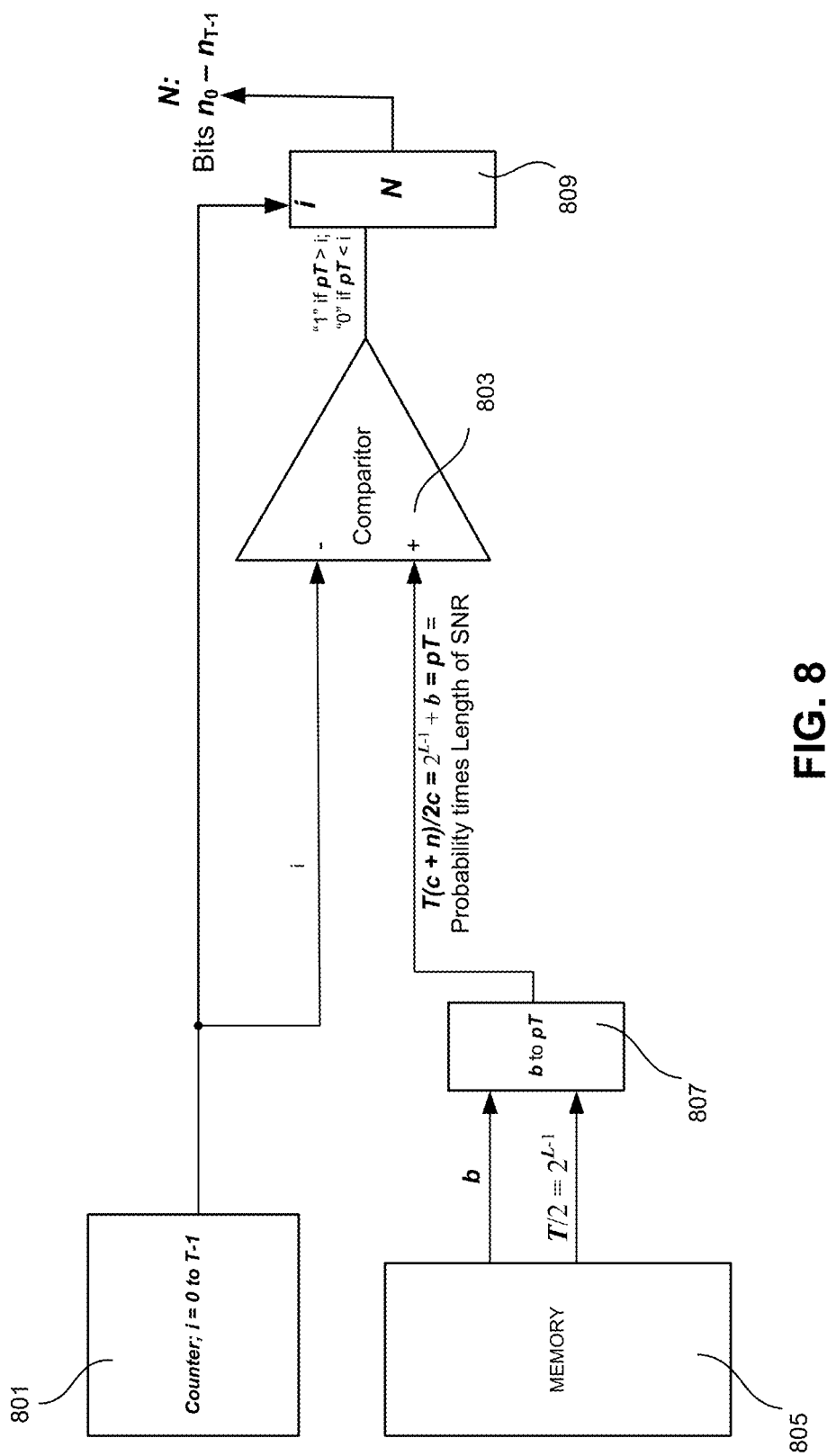
FIG. 8 is an illustration of a generator that generates ω-sequences.

FIG. 8 is an illustration of a generator that generates BSBS ω-sequences. A counter 801 provides a series of values that start at zero and increment by one in a sequence to T, where T is the length of the ω-sequence SBS sequence. The output of the counter 801 is coupled to the negative input of a comparator 803. A value b to be represented by the ω-sequence SBS sequence is taken from a source, such as a memory 805, and coupled to the input of a conversion block 807. The conversion block 807 converts the value b to a value that is equal to pT, the probability that a bit of the SBS sequence N will be a assigned a value of "1", multiplied by the number of bits T in the string N. In accordance with some embodiments:

$$p=(2^{L-1}+b)/2^L \quad \text{EQ. 1}$$

$$T=2^L \quad \text{EQ. 2}$$

$$2^{L-1}=T/2 \quad \text{EQ. 3}$$

$$pT=(2^{L-1}+b) \quad \text{EQ. 4}$$

where:
p is the probability that a bit in the BSBS sequence is assigned a value of "1";
L is the bit precision (i.e., the number of bits in the binary format used to express the magnitude) of the value to be converted from binary format to BSBS format;
T is the number of bits in the BSBS sequence; and
b expressed in binary format that is to be converted for representation in BSBS format.

Therefore, pT can be generated by summing T/2 with the binary value of b. For example, if the value b is a binary value of "0010" (representing a value of 2), represented in a 4-bit 2s-complement binary representation (a signed binary representation that can hold a value from −8 to 7), then the value of L is 3. For this example, $T=2^L=2^3=8$; represented in binary form as "01000". The value of $2^{L-1}$ is 4; "00100" in binary format, which is a simple right shift of T. Adding this binary value to the binary value of b yields $b+2^{L-1}=pT=00110$. It should be noted that the bit precision of the register needed to hold the value L must be at least one greater than the bit precision of the register needed to hold the value of b.

By applying $b+2^{L-1}=00110$ to the positive input of the comparator 803 and applying the value of i output from the counter 801 to the negative input of the comparator 801, the comparator will output a string in which the first 10 bits are ones and the following 6 bits are zeros (i.e., the desired ω-sequence representing the value 0010 binary as a BSBS sequence N having a length T=16). It can be seen that the ω-sequence generator 800 can generate the w-sequence using only simple addition and comparisons. The bits output from the comparator 803 are coupled to the input of a register 809 and stored under the control of an index, i output from the counter 801. The register outputs the string N having bits $n_0 - n_{T-1}$.

Figure 9:
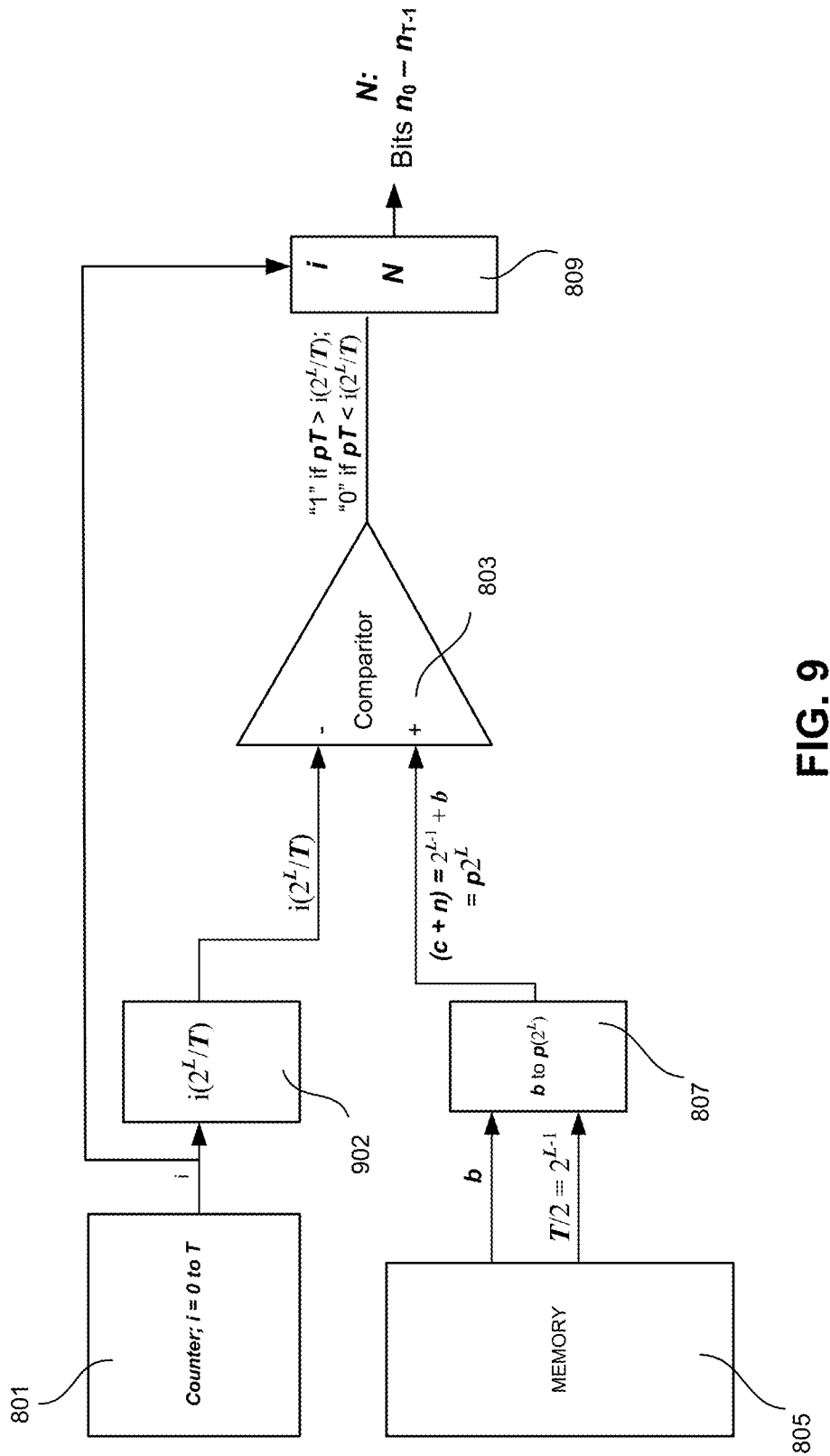
FIG. 9 is an illustration of a more generalized ω-sequence generator in which T is not equal to $2^L$.

FIG. 9 is an illustration of a more generalized ω-sequence generator 900 in which T is not equal to $2^L$. A second converter block 902 is coupled between the output of the counter 801 and the negative input of the comparator 803 to multiply the output of the counter 801 by $2^L/T$. It can be seen that if the length T of the SBS sequence is an integer multiple, for example, of the length $2^L$ of the binary representation of the value b to be converted, then the values are coupled to the negative input of the comparator 803 will run from 0 to $2^L$. In some embodiments, the scaling that is performed in converter block 902 can be performed by a shift of the input i, assuming the value of T is a power of 2. It should also be noted that for the ω-sequence generator 900 to output a complete ω-sequence, T must be greater than L. In accordance with some embodiment, T is an integer multiple of L.

A BSBS sequence generated using a ω-sequence has several properties of interest. The first of these properties is that the maximum relative error for the ω-sequence is less than 1/T. That is, converting a binary value to a SBS sequence, and then converting the SBS sequence back to a binary number will result in an relative error that is less than 1/T, where T is the length of the ω-sequence. Another property of a SBS sequence generated with an ω-sequence is that it can be generated without the use of a random number generator. Yet another property of a SBS that has been generated with an ω-sequence is that the SBS sequence will have the fewest possible transitions (state changes between one and zero). However, an accurate product cannot be obtained when multiplying a SBS sequence that has been generated using a ω-sequence generator with another SBS sequence that has been generated using a ω-sequence. Neither can an accurate product be attained when multiplying a SBS sequence that has been generated using a w-sequence with a time-shifted version of itself.

Another SBS generator that can be used in accordance with some embodiments of the disclosed method and apparatus generates an δ-sequence. Like the ω-sequence, a δ-sequence is also a string that presents a numerical value in either unipolar SBS format or bipolar SBS format. The δ-sequence may also be used either once or repeated multiple times within an SBS sequence. However, the δ-sequence evenly spreads the bit positions of the "1"s in the BSBS sequence out so that the "1"s are as spaced across the string.

Figure 10:
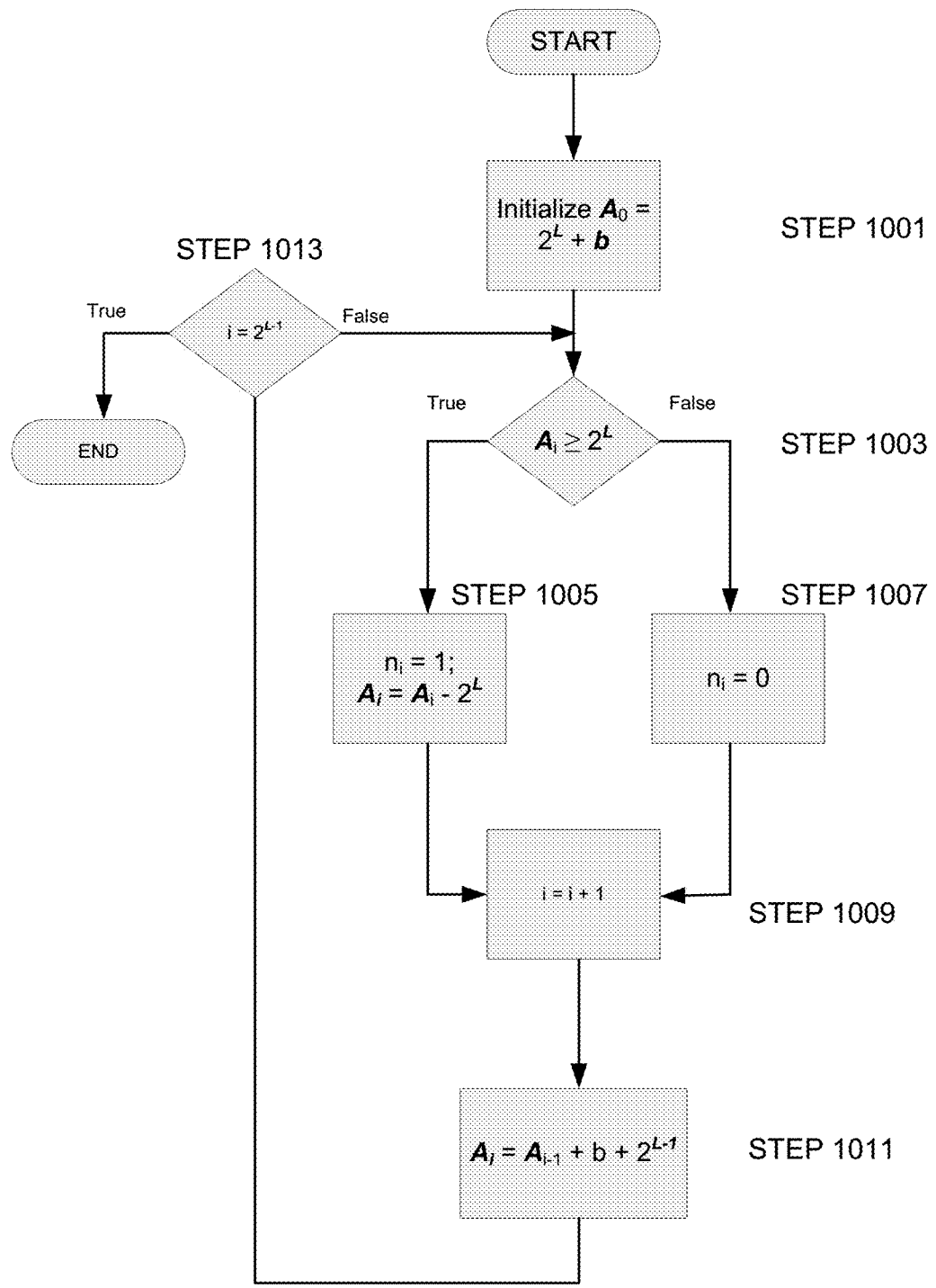
FIG. 10 is a flowchart of an algorithm that is used in some embodiments of the δ-sequence generator to distribute the ones evenly throughout the δ-sequence.

FIG. 10 is a flowchart of an algorithm that is used in some embodiments of the δ-sequence generator to generate a BSBS δ-sequence in which the ones are evenly distributed throughout the δ-sequence. To start, an index counter 1001 is initialized to zero and an accumulator A having a bit precision of L+1 is initialized to a value of $A_i = 2^L + b$ (STEP 1001). As noted above, the value of b is the value to be represented by the δ-sequence (i.e., converted from a two's complement binary representation to BSBS representation). It should be noted that the value $2^L$ is one greater than the maximum value that can be represented by b, since L is the length (i.e., bit precision) of the unsigned portion (or magnitude) of the binary value b. For example, if b is a 4-bit two's complement binary number, then L=4. It should be noted that a 4-bit two's complement binary number has a bit precision of 3 bits that represent the magnitude of the value and one bit that represents the polarity (i.e., negative or positive) of the value. Accordingly, for a two's complement representation of the value 4, b=0100. Accordingly, for $L=4: 2^{L-1} = 2^3 = 8$. Therefore, the range of values that can be represented by b is from 1000=−8 to 0111=7. Accordingly, the maximum value that can be represented by b is $7 = 2^{L-1} - 1 = 2^3 - 1$. A 4-bit two's complement representation of the value −4 is b=1100. The lead bit indicates that the value represented by the following three bits is negative; in this case the following three bits being 100 indicate the magnitude is 4 and the lead 1 indicates that the magnitude is negative.

By initializing the value of an accumulator, $A_0$ to $2^L + b$, the value of the accumulator, A is offset by an amount equal to the value of b from the value at which b overflows. When generating long sequences (i.e., in which T is much greater than c), the value to which the accumulator A is initialized has less consequence. Accordingly, the accumulator can be initialized to any arbitrary value. However, for shorter strings in which T≤c, initializing the accumulator to $2^L + b$ provides a more accurate result. The content $A_i$ of the accumulator A is then compared to $2^L$ to determine whether $A_i$ is greater than $2^L$ (STEP 1003). If b is positive, the comparison will be true. Alternatively, if b is negative, then the result of the comparison will be false. If true, then a bit $n_i$ of the δ-sequence, N is set to "1" and the value $A_i$ of the accumulator, A is decremented by $2^L$. (STEP 1005). If false, the bit $n_i$ of the δ-sequence, N is set to "0" and the value $A_i$ of the accumulator, A remains the same (STEP 1007). In either case, the index i is then incremented (STEP 1009). After incrementing the index, the value $A_i$ of the accumulator is updated to $A_i = A_{i-1} + b + 2^{L-1}$ (STEP 1011).

Figure 11:
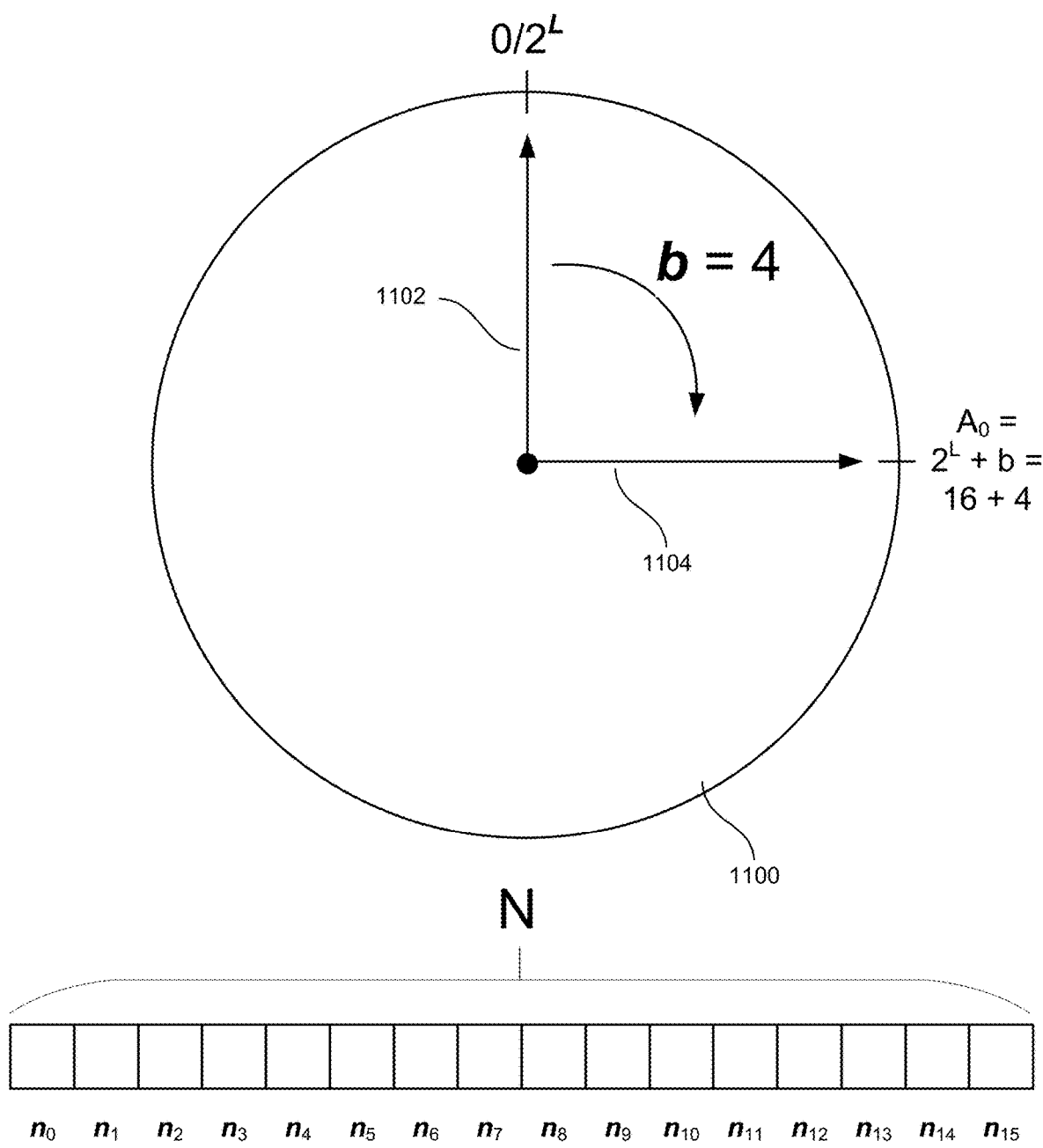
FIG. 11 provides a graphic representation of steps shown in the flowchart of FIG. 10.

FIG. 11 through FIG. 17 provide a graphic representation of the steps shown in the flowchart of FIG. 10. In FIG. 11, a circle 1100 is shown having zero/$2^L$ at the top (i.e., at zero degrees, top center) with values represented around the circle increasing linearly from 0 to $2^L$ in a clockwise direction around the circle. In the example shown, L=4 and b=4. The circle 1100 illustrates the state of the accumulator A with the index, i=0. A first pointer 1102 is shown at the position $2^L = 2^4 = 16$. A second pointer 1104 is shown pointing at the position $A_0 = 2^L + b = 16 + 4 = 20$ (i.e., the point on the circle representing the value $A_0$ to which the accumulator A is initialized when the index i=0). Upon performing the comparison in STEP 1003, the value of $A_0 = 20$ is greater than $2^L = 16$. Accordingly, on the first pass through STEP 1103, the answer is "true". STEP 1005 is performed and the value of the first bit $n_i = n_0$ for i=0 is set to "1". The bits $n_0$-$n_{15}$ of the δ-sequence, N are shown, with the value of no set to 1.

Figure 12:
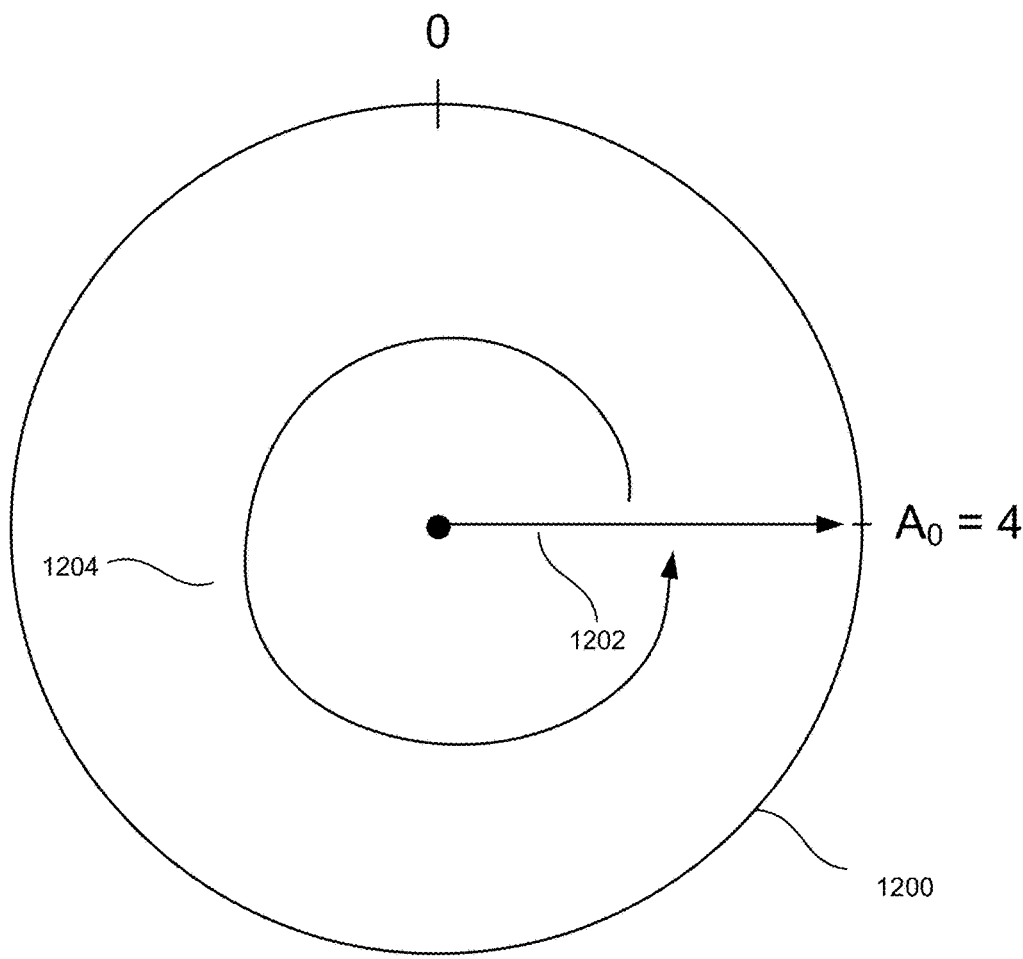
FIG. 12 is a graphical representation of the value $A_i$ for i=0.
Figure 12:
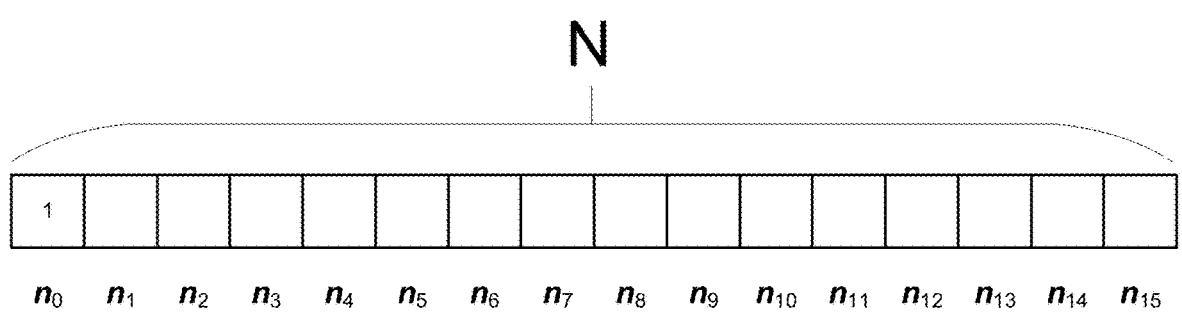

FIG. 12 illustrates the value $A_i$ for i=0, which is calculated as $A_0 = A_0 - 2^L = 20 - 16 = 4$ in STEP 1005. The arrow 1204 indicates the counterclockwise rotation of the pointer 1102 to the position shown for the pointer 1202. Note that the index is not yet incremented and the position of the pointer 1202 on the circle 1200 is the same for both values of $A_0$; 20 and 4.

FIG. 13 illustrates the condition once STEP 1009 has been performed. In STEP 1009 the index i is incremented. Next, STEP 1011 is performed, in which the next value $A_1$ is calculated as $A_1 = A_0 + b + 2^{L-1} = 4 + 4 + 8 = 16$. The pointer 1202 rotates to the top of the circle 1300, as shown by pointer 1302 and arrow 1304. The index i is then checked to see whether all of the bits of the δ-sequence, N have been generated (STEP 1013). If not, then the process returns to STEP 1003 in which the value $A_1$ is compared to 16. Since $A_1 = 16$ is equal to $2^L = 16$ (i.e., STEP 1003 is true), STEP 1005 is performed. Accordingly, the value of $n_1$ is set to 1 and the value of $A_1$ is decremented to 0 (STEP 1005), as shown by the arrow 1306 indicating the counterclockwise rotation of the pointer 1302.

Figure 14:
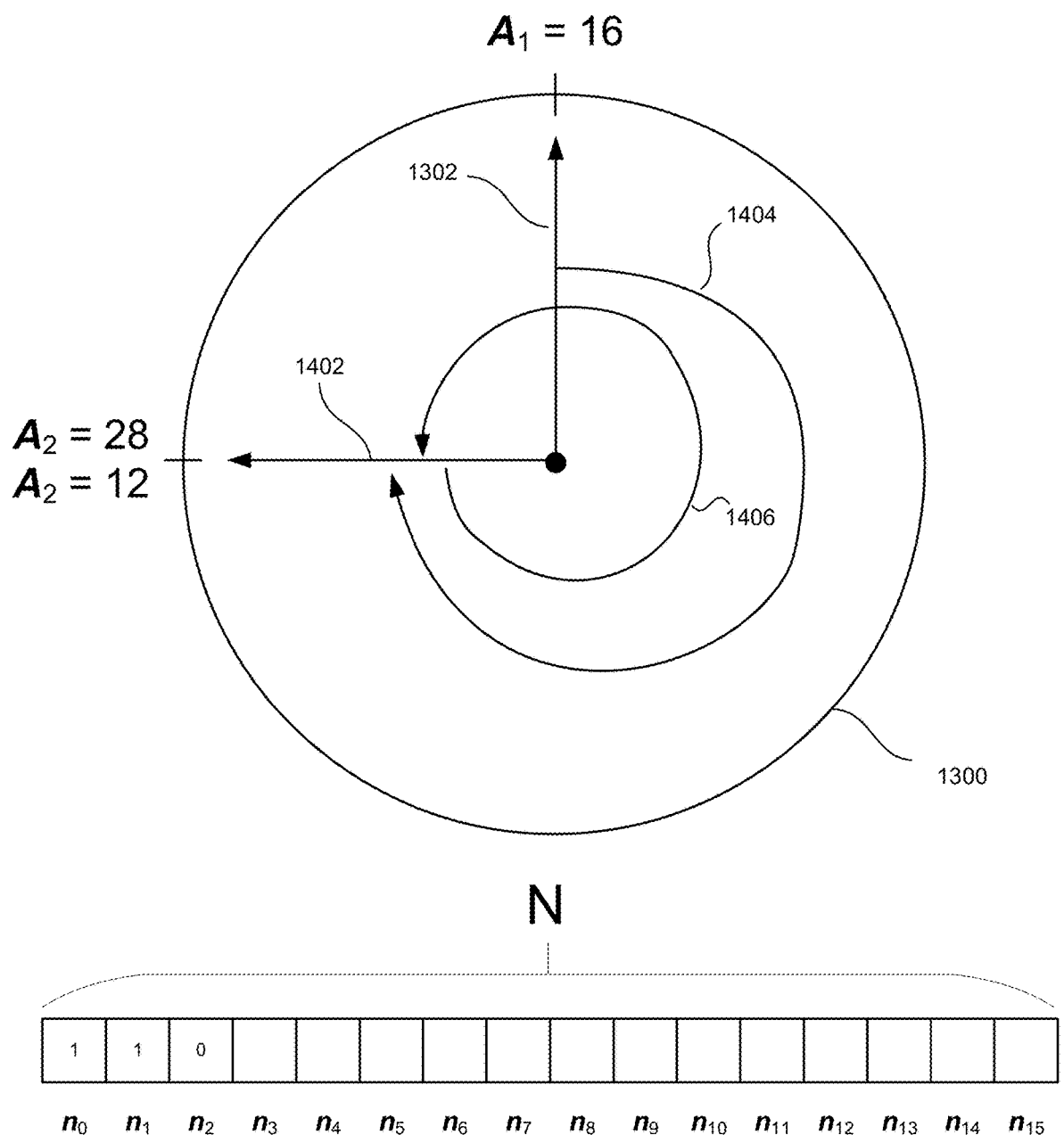
FIG. 14 is a graphical representation showing the value of the accumulator A after the index, i has been incremented to 2.

FIG. 14 illustrates the incrementing of the index, i to 2 in STEP 1009, the calculation of the value of $A_2 = A_1 + b + 2^{L-1} = 0 + 4 + 8 = 12$ in STEP 1011 and the resulting position of a pointer 1402 representing the value of $A_2$. An arrow 1404 shows the rotation of the pointer 1302 to the new location 1402. Since $A_2 = 12$ is less than 16, the value of the bit $n_2$ as determined in STEP 1007 is set to 0.

Figure 15:
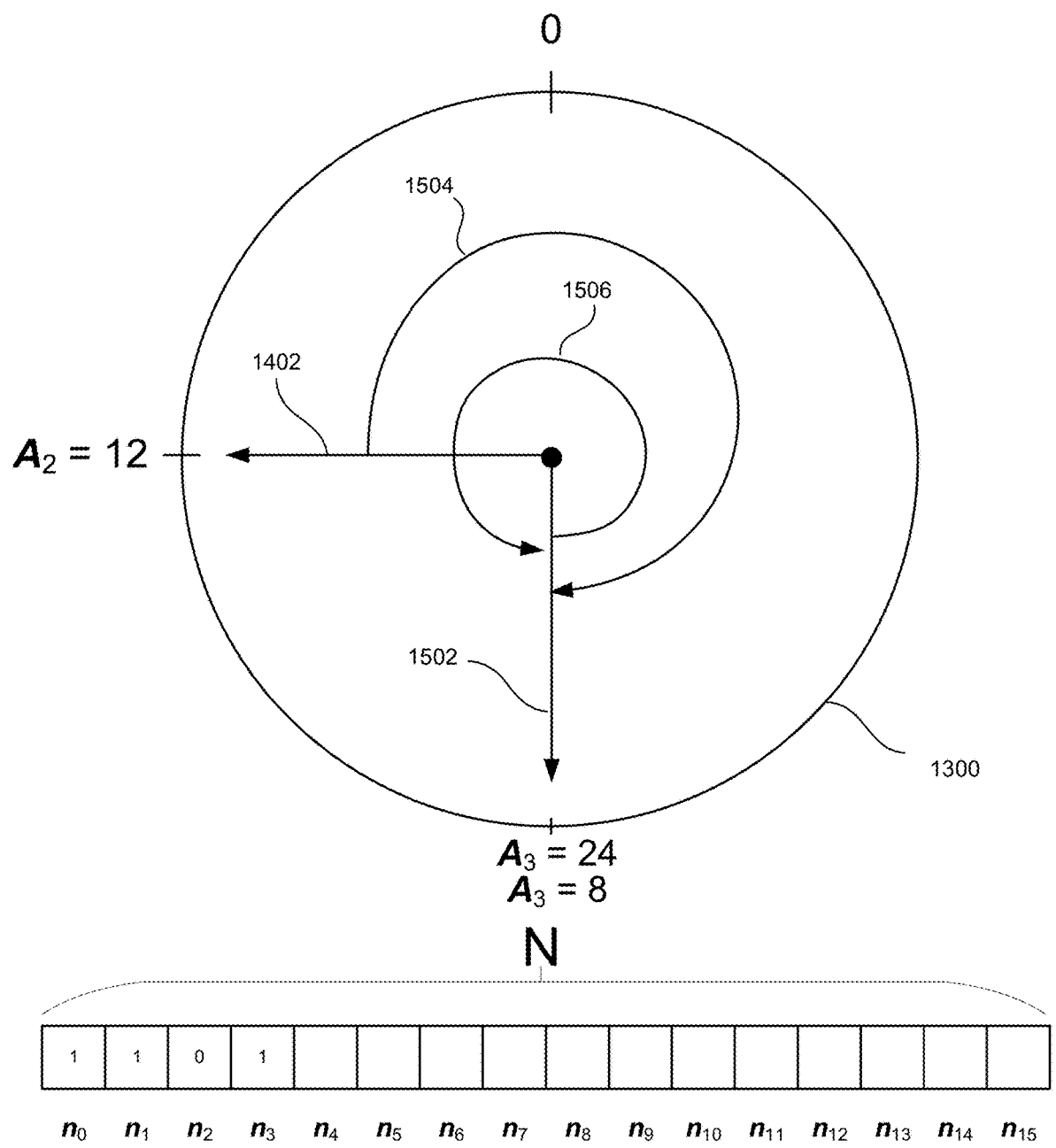
FIG. 15 is a graphical representation showing the value of the accumulator A after the next pass through STEP 1009, in which the index is incremented to i=3.

FIG. 15 illustrates the next pass through STEP 1009, in which the index is incremented to i=3. In STEP 1011, a new value is calculated for $A_3 = A_2 + b + 2^{L-1} = 12 + 4 + 8 = 24$. An arrow 1504 shows the rotation of the pointer 1402 to the new location 1502. The index i is then checked to see whether all of the bits of the δ-sequence, N have been generated (STEP 1013). If not, then the process returns to STEP 1003. In STEP 1003, $A_{3=24}$ is compared to $2^L = 16$. Since $A_3$ is greater than $2^L$, the value of $n_3$ is set to 1 and a new value is calculated for $A_3$ in STEP 1005. The new value is $A_3 = A_3 - 2^L = 24 - 16 = 8$, which locates the new pointer at the same position, as indicated by arrow 1506.

Figure 16:
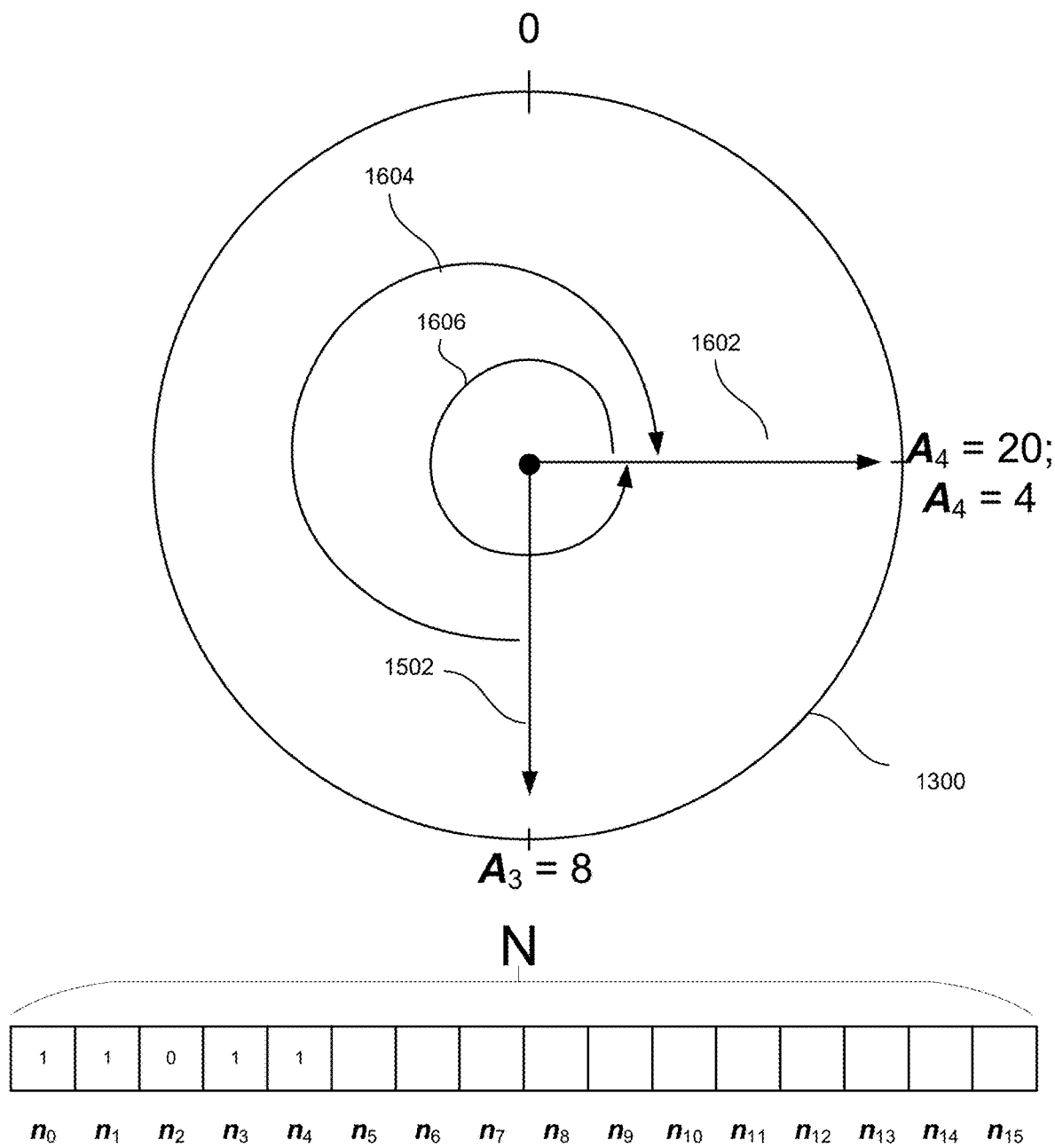
FIG. 16 is a graphical representation showing the value of the accumulator A after the next pass through STEP 1009, in which the index is incremented to i=4.

FIG. 16 illustrates the next pass through STEP 1009, in which the index is incremented to i=4. In STEP 1011, a new value is calculated for $A_4 = A_3 + b + 2^{L-1} = 8 + 4 + 8 = 20$. An arrow 1604 shows the rotation of the pointer 1402 to the new location 1602. The index i is then checked to see whether all of the bits of the δ-sequence, N have been generated (STEP 1013). If not, then the process returns to STEP 1003. In STEP 1003, $A_4 = 20$ is compared to $2^L = 16$. Since $A_4$ is greater than $2^L$, the value of $n_4$ is set to 1 and a new value is calculated for $A_4$ in STEP 1005. The new value is $A_4 = A_4 - 2^L = 20 - 16 = 4$, which locates the new pointer 1602 at the same position, as indicated by arrow 1606. It can be seen that the pointer 1602 is now back to the same location as the pointer 1202 shown in FIG. 12. Accordingly, when the index increments to i=5, the process will proceed exactly as it did when the index was incremented to i=1. Therefore, it can be seen that the value of the bit $n_5$ will be set to 1 and the value of $A_5$ will be calculated to be the same as the value of $A_1$=16. Similarly, the value of the bit $n_6$ will be set to 0, the same as bit $n_2$ and the value of $A_6$ will be calculated to be the same as the value of $A_{2=12}$. This pattern will continue for all the remaining bits from $n_7$ through $n_{15}$, with bit $n_{15}$ having the same value as bit $n_3$. The index i is checked to see whether all of the bits of the δ-sequence, N have been generated (STEP 1013). Once the index i, is equal to $2^L-1=16-1=15$, the process ends.

Figure 17:
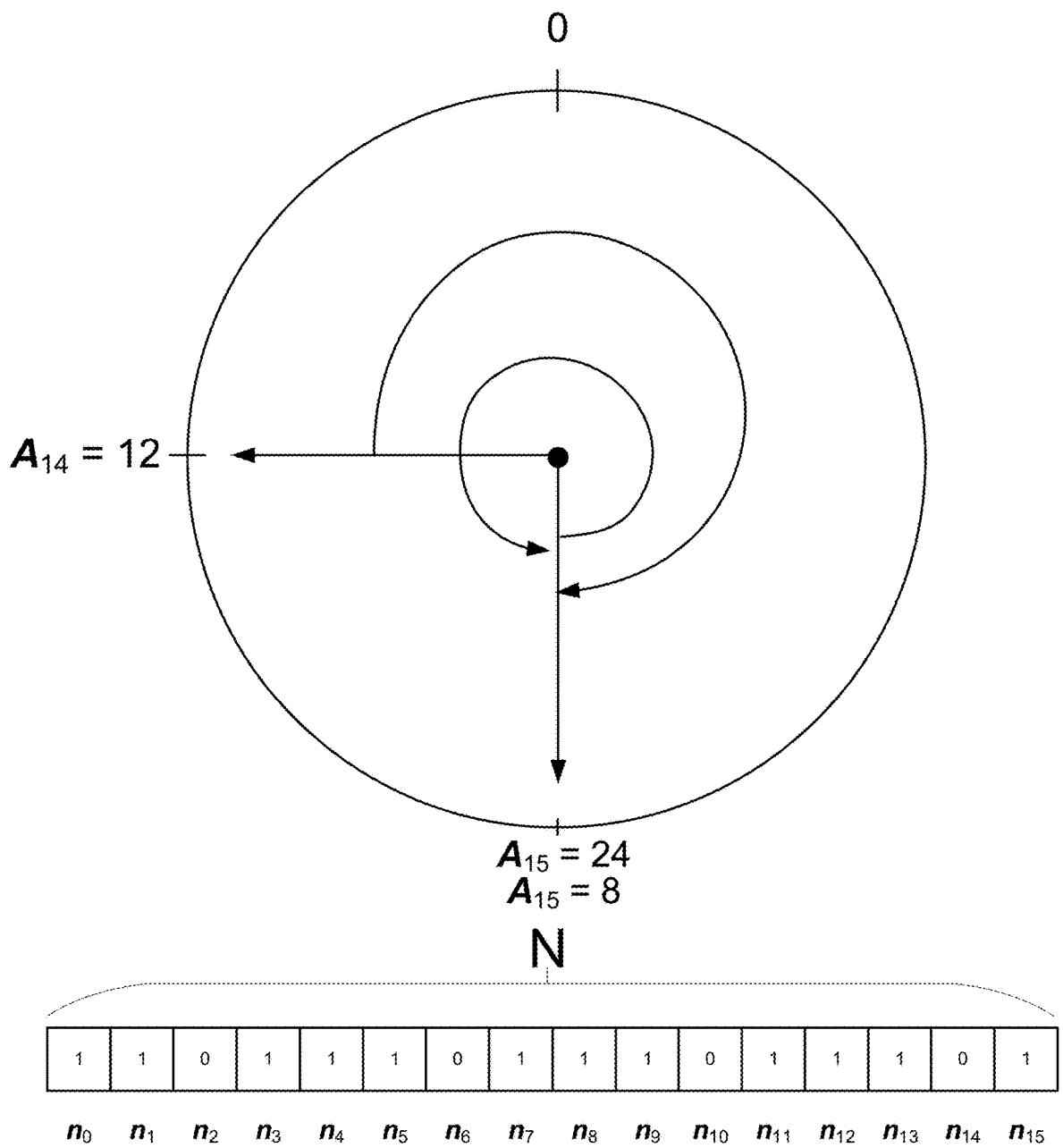
FIG. 17 is a graphical representation showing the value of the accumulator A after the index, i has been incremented to the terminal value.

FIG. 17 illustrates the result of the operation performed. In STEP 1013, the index i=15. Once the process determines that the index i has reached 15, each of the bits $n_0$ through $n_{15}$ will then have been determined and the process ends. As can be seen from the values of the bits $n_0$-$n_{15}$, the ones and the zeros have been evenly distributed over the 16 bits of the δ-sequence N. For each bit that is zero, there are three bits that are ones.

Figure 18:
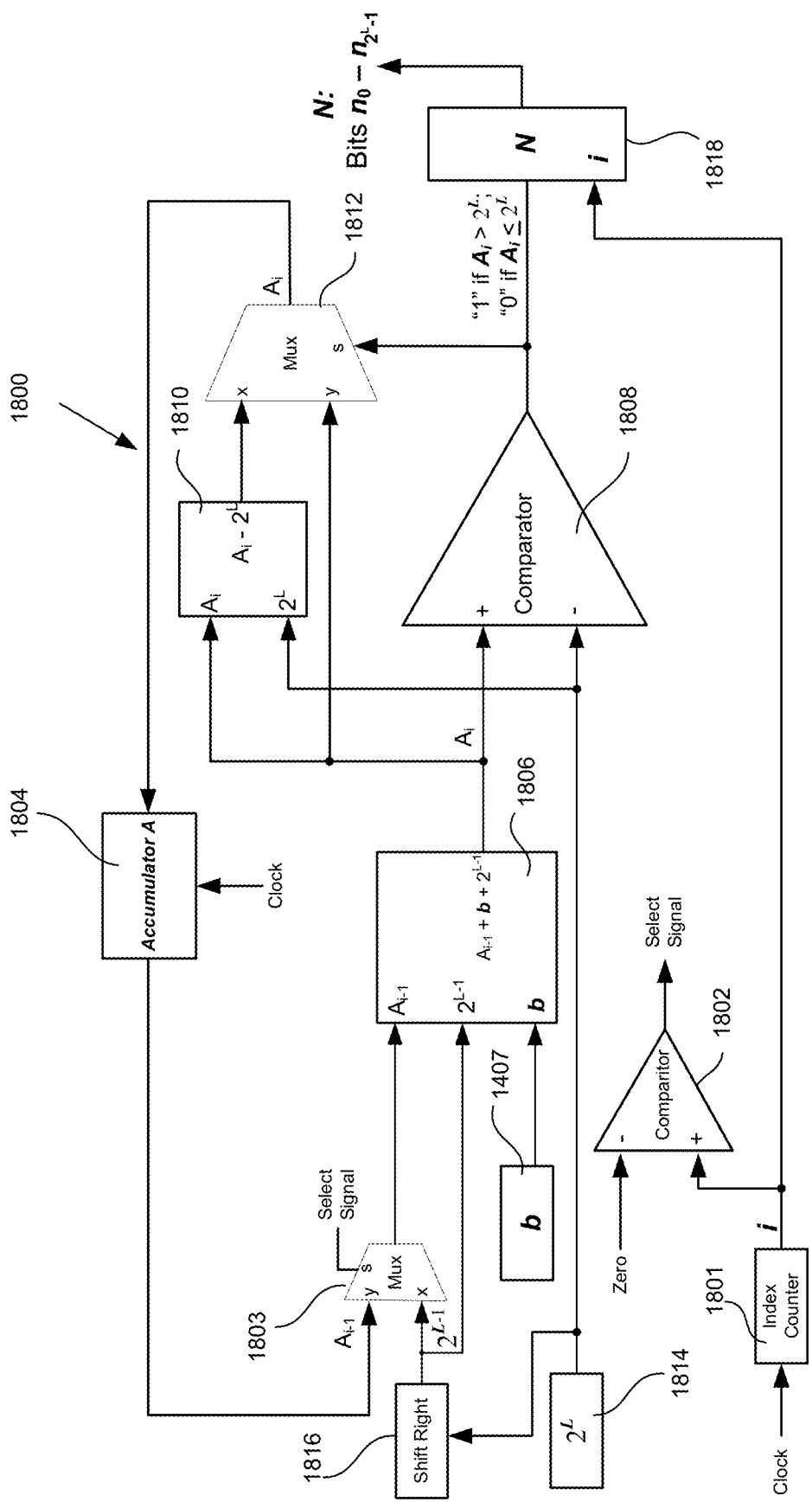
FIG. 18 is an illustration of one embodiment for implementing the δ-sequence.

FIG. 18 is an illustration of one embodiment for implementing the δ-sequence 1800. Initially, an index counter 1801 is initialized to a count of i=0. A clock coupled to the counter increments the counter to a terminal value of $2^L-1$, at which point the counter wraps around to zero (i.e., modulo $2^L$). The output of the index counter 1801 is coupled to the input of a comparator 1802. The comparator 1802 generates a select signal by comparing the index value i output from the index counter 1801 to zero. If i=zero, the select signal is one; otherwise, the select signal is zero. The select signal is coupled to a multiplexer 1803 that selects between an initialization value of $2^{L-1}$ coupled to an "x" input of the multiplexer and the current value stored in an accumulator A 1804 coupled to a "y" input to the multiplexer 1803 based on the select signal applied to the "s" input to the multiplexer 1803 from the comparator 1802. The select signal determines which of the inputs will be coupled to the output of the multiplexer 1803. The select signal causes the "x" input to be coupled to the output of the multiplexer 1803 when the index i is zero. The output of the multiplexer 1803 is coupled to a first input, $A_{i-1}$ to a summing circuit 1806 when the index i is a value greater than zero.

The multiplexer has two additional inputs, $2^{L-1}$ and b. The first of these additional inputs, $2^{L-1}$ is coupled a source of the value $2^{L-1}$ In accordance with some embodiments of the disclosed method and apparatus, the output of a register 1814 in which a value of $2^L$ is stored is coupled to the input of a right shift register 1816. In such embodiments, the value $2^{L-1}$ is derived by performing a right shift of the output of the register 1814. Alternatively, a register (not shown) stores the value $2^{L-1}$ The second of the additional inputs, b is coupled to a memory register 1407 in which the value b is stored. The value b is the value to be converted from a two's complement binary representation to a BSBS sequence.

The output of the summing circuit 1806 is the sum of the three outputs $A_{i-1}$+b+$2^{L-1}$ The output of the summing circuit 1806 is an intermediate value of $A_i$. This intermediate value of $A_i$ coupled to three different circuits. The first of these three circuits is a comparator 1808. The second of the three circuits is a difference circuit 1810. The third of the circuits is a multiplexer 1812. The positive input to the comparator 1808 receives the output of the summing circuit 1806. The negative input to the comparator 1808 is coupled to the register 1814 in which the value $2^L$ is stored. If the positive input is greater than the negative input, then the output of the comparator 1808 is a one. That is, if the sum $A_1$=$A_{i-1}$+b+ $2^{L-1}$ produced by the summing circuit 1806 is greater than $2^L$ then the comparator outputs a "1". Otherwise, the comparator outputs a "0".

The output of the comparator 1808 is coupled to the select input of the multiplexer 1812. When the comparator outputs a "1", the multiplexer 1808 couples the "x" input to the output of the multiplexer 1808. The "x" input to the multiplexer 1808 is coupled to the output of the difference circuit 1810. The difference circuit 1810 outputs the difference between $2^L$ and the intermediate value of $A_i$. When the comparator 1808 outputs a "0", the multiplexer 1810 couples the intermediate value of $A_i$ to the output of the multiplexer 1810. The output of the multiplexer 1812 is coupled to the input of the accumulator A 1804. A clock, which may either be the clock that increments the index counter 1801 or a clock derived from that clock, determines when the value $A_i$ should be updated.

Accordingly, when the value of the sum $A_{i-1}$+b+$2^{L-1}$ is greater than $2^L$, the multiplexer 1812 sets the value of $A_1$ equal to $A_1$ minus $2^L$. Alternatively, when the value of the sum $A_{i-1}$+b+$2^{L-1}$ is less than, or equal to $2^L$, the multiplexer 1812 sets the value of $A_i$ equal to the intermediate value of $A_i$ output from the summing circuit 1806.

The output of the comparator 1808 is also coupled to the input to an N register 1818 that holds the values of each of the bits $n_i$ of the δ-sequence N. The index i is used to save the bits $n_i$ of the δ-sequence in distinct bit locations associated with the value of the index i. It should be noted that the δ-sequence generator 1800 comprises very simple circuit element, such as a counter 1801, a summing circuit 1806, a difference circuit 1810, 2 comparators 1802, 1808, 2 multiplexers 1803, 1812, a shift register 1816 and four registers 1804, 1807, 1814, 1818.

Figure 19:
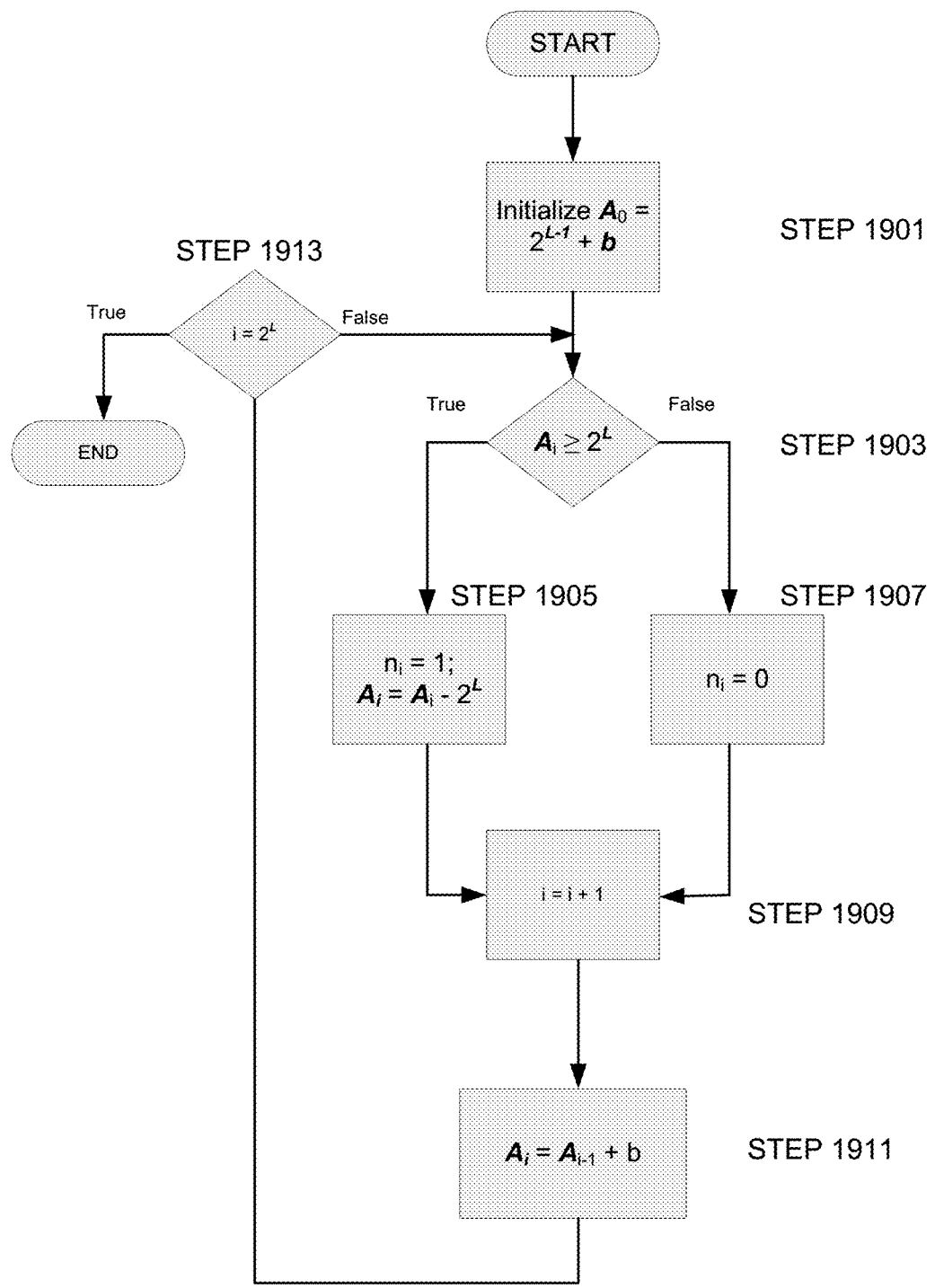
FIG. 19 is a flowchart of the steps performed by a δ-sequence generator to generate a USBS sequence.

FIG. 19 is a flowchart of the steps performed by a δ-sequence generator to generate a USBS sequence. Initially, the accumulator value $A_0$ is set to $2^{L-1}$+b (STEP 1901). If the initialized value of $A_0$ is greater than or equal to $2^L$, then the bit no is set to 1 and the value of the accumulator is decremented by $2^L$ (STEP 1905). Otherwise, if the value $A_0$ is less than $2^L$, the value of the bit no is set to 0 (STEP 1907). In either case, the next step is to increment the index i (STEP 1909). For the unipolar SBS generator, the accumulator value $A_i$ is incremented by b (STEP 1911). The value of the index i is checked to see whether all of the bits have been generated by comparing the index value i, to $2^L$ (STEP 1913). If equal, then the process ends. Otherwise, the process continues on, returning to STEP 1903.

An SBS sequence generated using a δ-sequence has several properties of interest. The first of these properties is that, similar to the ω-sequence, the maximum error for the δ-sequence is less than 1/T. That is, converting a binary value to an SBS sequence, and then converting the SBS sequence back to a binary number will result in an error that is less than 1/T, where T is the length of the δ-sequence. Another property of an SBS sequence generated with an δ-sequence is that it can be generated without the use of a random number generator. Yet another property of an SBS that has been generated with an δ-sequence is that the SBS sequence will have the maximum number of transitions possible (state changes between one and zero). However, similar to an ω-sequence, an accurate product cannot be obtained when multiplying an SBS sequence that has been generated using a δ-sequence generator with another SBS sequence that has been generated using a δ-sequence. Neither can an accurate product be attained when multiplying a SBS sequence that has been generated using a δ-sequence with a time-shifted version of itself. Nonetheless, a SBS sequence that has been generated using an ω-sequence can be multiplied with a SBS sequence that has been generated using a δ-sequence.

Another SBS generator that can be used in accordance with some embodiments of the disclosed method and apparatus generates an σ-sequence. Like the ω-sequence and δ-sequence, the σ-sequence is also a string that presents a numerical value in bipolar BSBS format. The σ-sequence may also be used either once or repeated multiple times within an SBS sequence. That is, several σ-sequence strings can be concatenated together to form one SBS sequence. The σ-sequence is similar to the ρ-sequence, but is more useful in cases in which it is desirable for the SBS sequences generated to obey the additive inverse identity property. That is, a ρ-sequence representing a binary value of b subtracted from another ρ-sequence representing the same value will result in zero if the two ρ-sequences are constructed using the same random number sequence.

Figure 20:
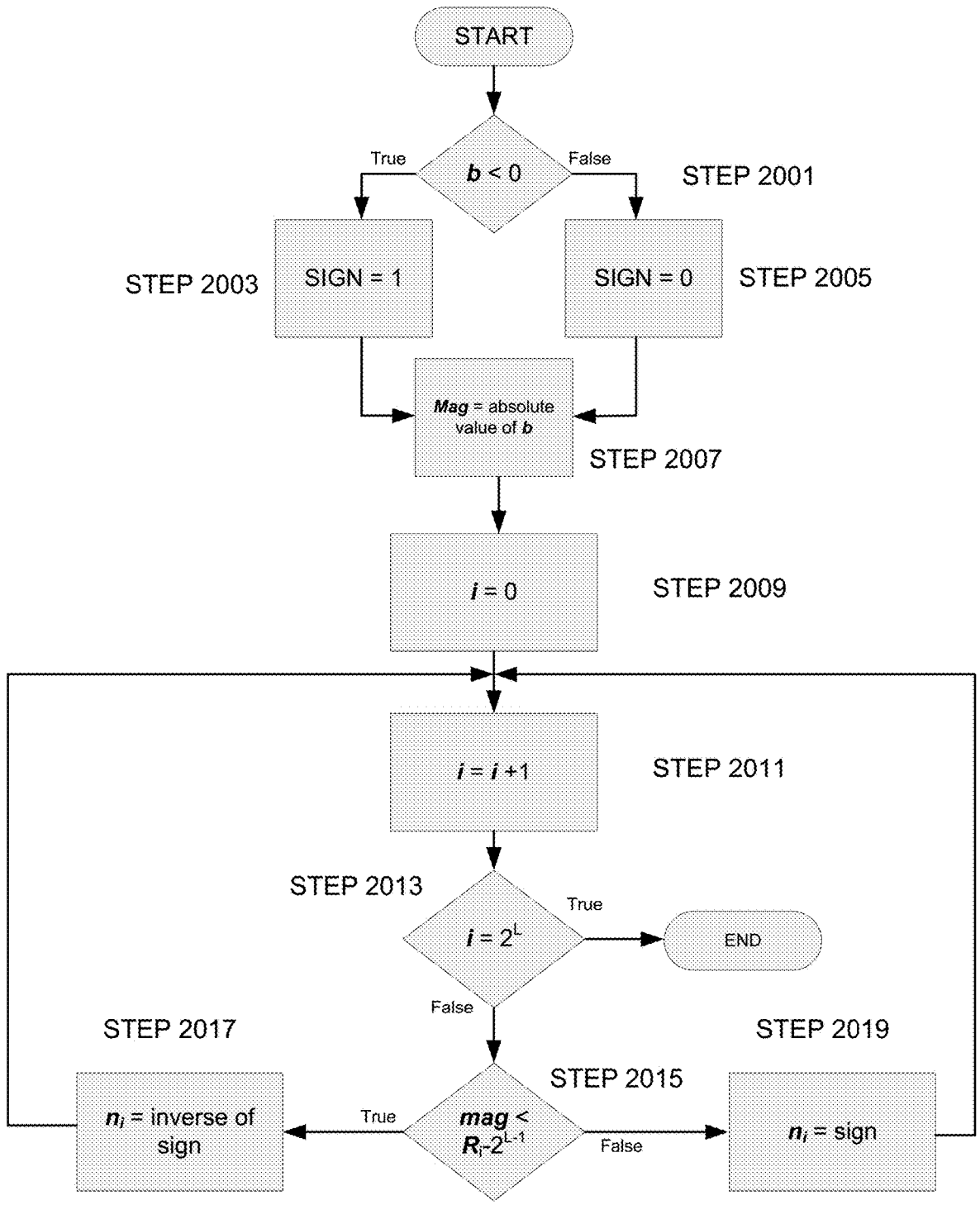
FIG. 20 is a flowchart of an algorithm that is used in some embodiments to generate a σ-sequence.

FIG. 20 is a flowchart of an algorithm that is used in some embodiments to generate a bipolar SBS σ-sequence. The process begins with a comparison of b to zero (STEP 2001). If b<0 is true, then a variable "SIGN" is set to 1 (STEP 2003). Otherwise, SIGN is set to 0 (STEP 2005). In either case, a second variable "mag" is set to the absolute value of b (STEP 2007). Next, an index counter is initialized to zero (STEP 2009). The index value, i of the index counter is incremented (STEP 2011). The value of i is checked to see whether the σ-sequence string is complete (i.e., whether the index, $i=2^L$) (STEP 2013). If false, then mag is checked for mag $<R_i-2^{L-1}$ (STEP 2015), recalling that $R_i$ is a random number output from a PRNG. If true, the bit $n_i$ is set to the inverse of SIGN (STEP 2017). If false, then bit $n_i$ is set to SIGN (STEP 2019). The process returns to STEP 2011 and end when STEP 2015 is true.

Figure 21:
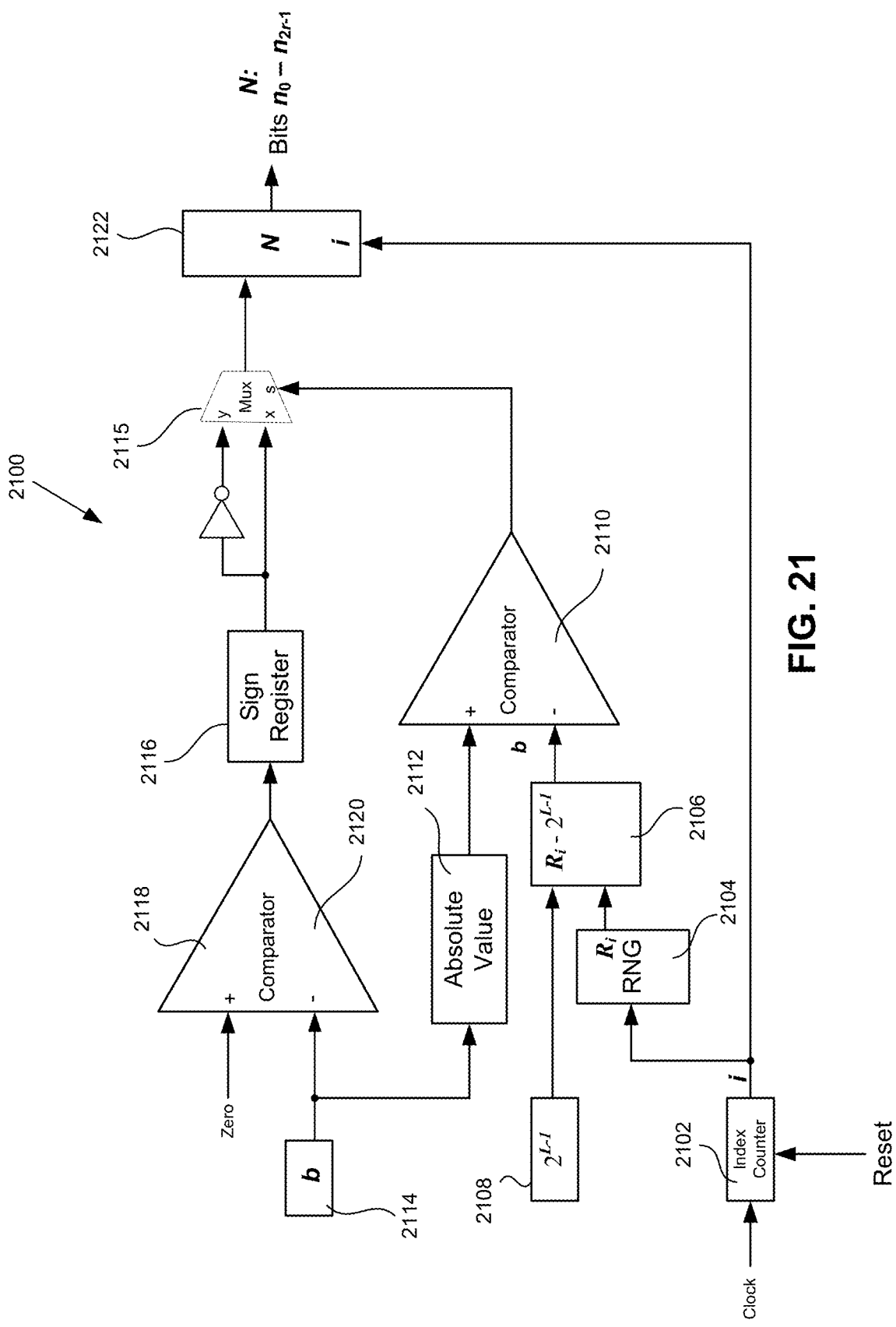
FIG. 21 is an illustration of an example of a circuit for implementing a σ-sequence generator.

FIG. 21 is an illustration of an example of a circuit for implementing a σ-sequence generator 2100. A reset signal is initially applied to an index counter 2102 to reset the index, i output of the counter 2102 to zero. The index i is coupled to the input of a pseudo random number generator (PRNG) 2104. For each distinct value of i, the PRNG 2104 outputs a random value, $R_i$. within the range of zero to $2^L-1$. The output $R_i$ of the PRNG 2104 is coupled to a first input of a difference circuit 2106. A second input of the difference circuit 2106 is coupled to the output of a register 2108 in which the value $2^{L-1}$ is stored. The difference circuit 2106 outputs the difference $R_i-2^{L-1}$ which is coupled to the negative input (i.e., inverting input) of a comparator 2110. The positive input is coupled to the output of an absolute value circuit 2112. The input to the absolute value circuit 2112 is coupled to the output of a register 2114 in which the value of b is stored.

The comparator 2110 compares the absolute value of b to each random number, $R_i$ generated by the PRNG 2106 as the index counter 2102 increments through the index values, i. For each value of i, the comparator determines whether the absolute value of b is greater than the difference $R_i-2^{L-1}$. With the random values, $R_i$ output from the RNG 2106 being in the range from 0 through $2^{L-1}$, and assumed to be truly random, the probability that the output of the comparator 2110 will be true is equal to $p=(b+2^{-1})/2^L$ for values of b that are in the range of $-2^{L-1}$ to $2^{L-1}$. It can be seen that the term $(b+2^{L-1})$ shifts the value of the numerator upward from the value of b by $2^L$. This serves to effectively place the range of numerator in a range from 0 to $2^L-1$.

The output of the comparator 2110 is coupled to a select input of a multiplexer 2115. Accordingly, the output of the comparator 2110 determines whether the "x input" or the "y input" of the multiplexer 2115 is coupled to the multiplexer 2115 output. The "x input" is coupled directly to the output of a SIGN register 2116. The SIGN register 2116 stores a value that is provided by the output of a comparator 2118. The comparator 2118 is a "1" for values of b that are less than zero (negative) and "0" for values of b that are greater than or equal to zero. The "y input" to the multiplexer 2115 is coupled to an inverter 2120. The input of the inverter 2120 is coupled to the output of the SIGN register 2116. The output of the multiplexer 2115 is coupled to a register 2122 that stores each of the values of the bits, $n_i$ of the string N under the control of the index, i.

Accordingly, the probability that $n_i$ is set to the value stored in the SIGN register 2116 is equal to $p=(b+2^{L-1})/2^L$ the probability that the output of the comparator 2110 is a "1". The benefit gained by generating an SBS sequence using the α-sequence generator is that such a SBS sequence will obey the additive inverse identity, assuming the same string of values $R_i$ is used to generate both the SBS sequences that represent the positive value and the negative value that are summed. In the case in which the PRNG 2104 is a pseudo random number generator, the values of $R_i$ will be the same if the same seed is used to generate the values of $R_i$. All of the other characteristics of SBS sequences generated using the σ-sequence generator are the same as those of SBS sequences generated using a ρ-sequence generator.

Another SBS generator that can be used in accordance with some embodiments of the disclosed method and apparatus generates a ζ-sequence. Like the ω-sequence, δ-sequence, and σ-sequence, the ζ-sequence is also a string that presents a numerical value in bipolar BSBS format. The ζ-sequence may be used either once or repeated multiple times within an SBS sequence. That is, several ζ-sequence strings can be concatenated together to form one BSBS sequence. ζ-sequence strings always represent a value of zero, and are of particular use when multiplying by zero.

A ζ-sequence has two parameters that define the nature of strings generated using a ζ-sequence generator. These parameters are referred to herein as "r" and "s", where r is an integer of value 1 or greater and s is an integer in the range of 0 to r−1. A ζ-sequence string is defined as having s bits that are assigned a value of "0", followed by r bits assigned a value of "1", followed by r−s bits assigned a value of "0". Accordingly, the total number of bits, T in string generated with a ζ-sequence generator is T=r+s+r−s=2r.

The following are examples of some strings that contain multiple instances of a ζ-sequence, ζ(r,s):

ζ(1,0): $[10]^{T=2r=2}$=10, 10, 10, 10, 10, 10, 10, 10, 10, 10, 10, 10, 10, 1 . . .

ζ(2,0): $[1100]^{T=2r=4}$=1100, 1100, 1100, 1100, 1100, 1100, 1100, 1 . . .

ζ(2,1): $[0110]^{T=2r=4}$=0110, 0110, 0110, 0110, 0110, 0110, 0110, 0 . . .

ζ(3,2): $[001110]^{T=2r=6}$=001110, 001110, 001110, 001110, 001110, 0 . . .

Commas are inserted between each individual ζ-sequence within the string generated by concatenating several ζ-sequences together. The value within the brackets indicates the pattern of ones and zeros within the ζ-sequence. The superscript indicates the length of the ζ-sequence. It can be seen that there will be r bits assigned to a value of "1" and the same number, s+r−s=r bits assigned to a value of "0". Thus, the resulting ζ-sequence always represents a value of zero. However, the pattern of "1"s and "0"s can be defined by setting the values of the parameters, r and s.

Figure 22:
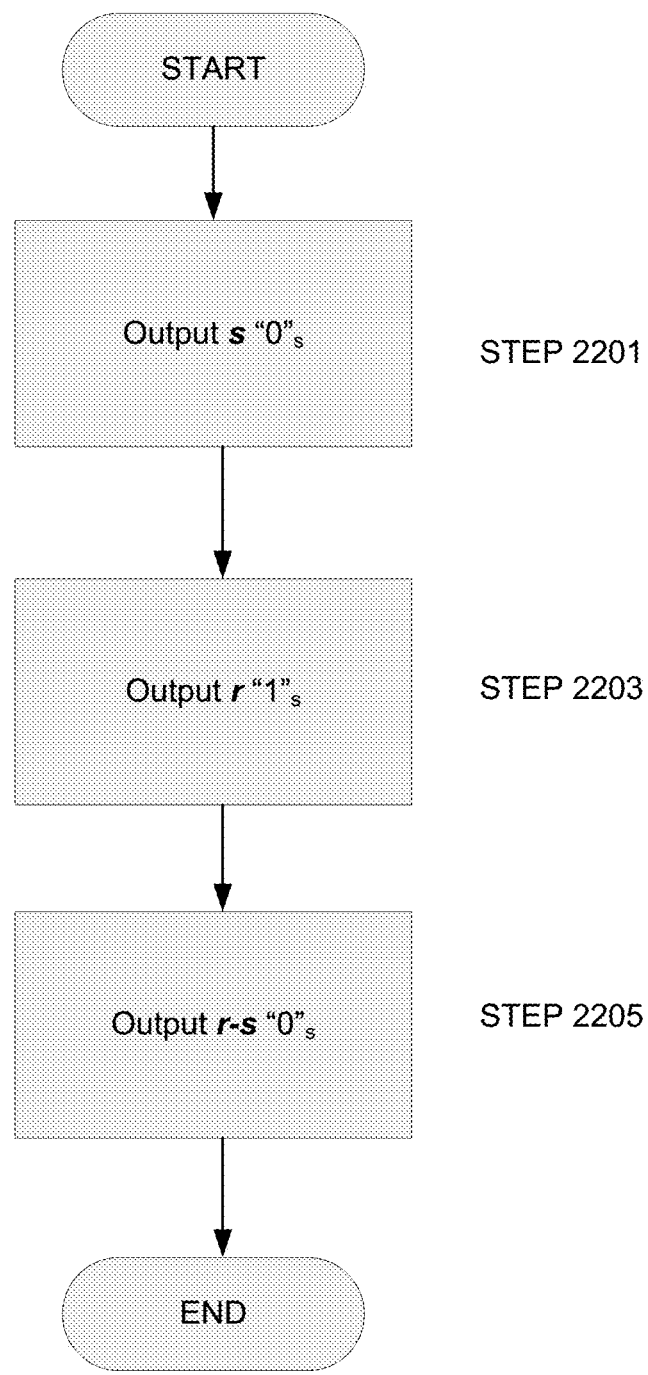
FIG. 22 is a flowchart of the method used to generate a ζ-sequence.

FIG. 22 is a flowchart of the method used to generate a ζ-sequence. The process begins by outputting s zeros (STEP 2201). Using the first example, ζ(r,s)=ζ(1,0), since s=0, there are no leading zeros in the string (i.e., no output is provided in STEP 2201). Next, since r=1, the number of bits that are output with an assigned value of "1" is 1 (STEP 2203). Finally, since r−s=1, an additional bit is output with a value assigned to "0" (STEP 2205). This process can be repeated to form a BSBS sequence that has a length that is an integer multiple of 2r.

Figure 23:
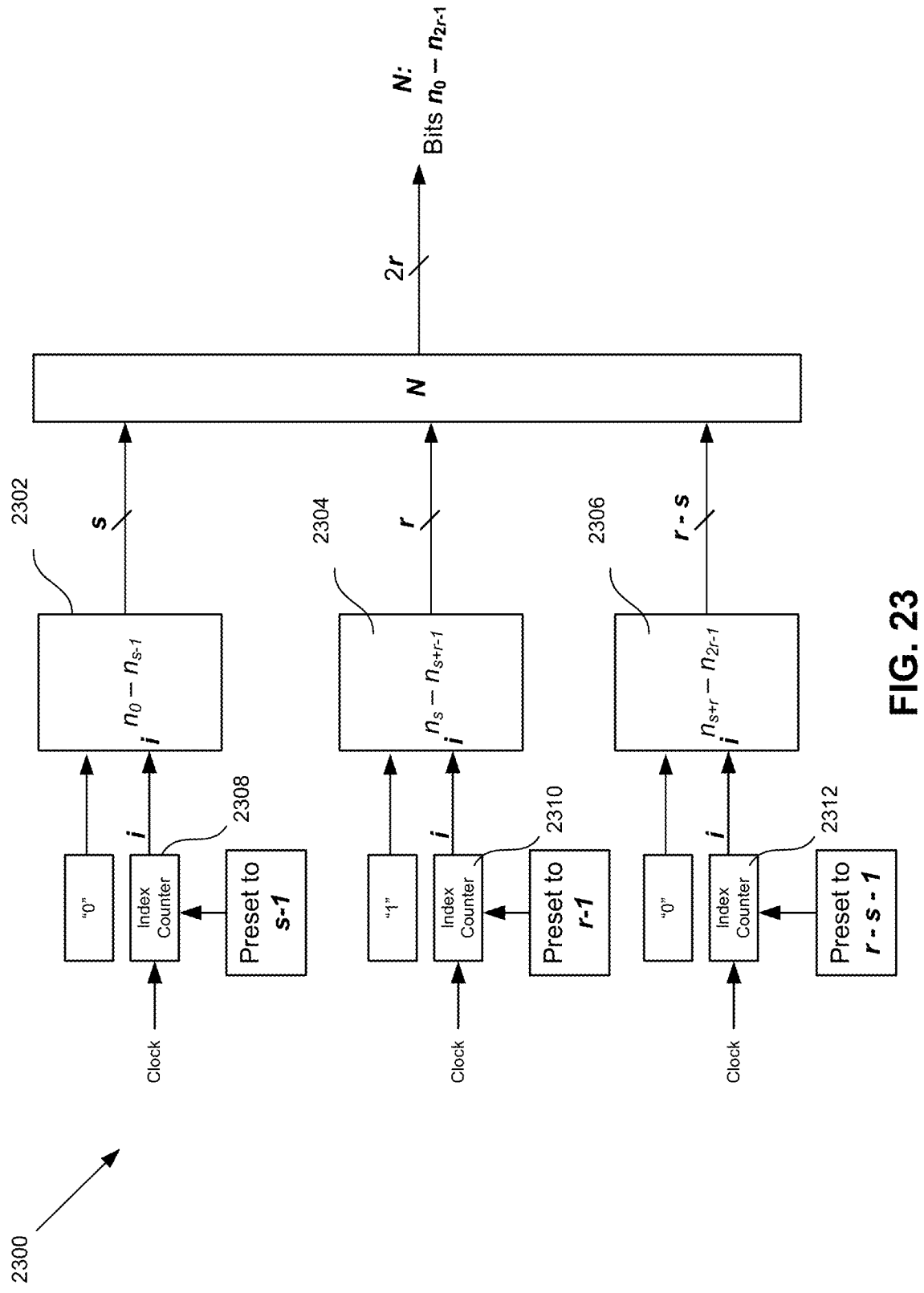
FIG. 23 is a simplified illustration of one embodiment for implementing a ζ-sequence generator.

FIG. 23 is a simplified illustration of one embodiment for implementing a ζ-sequence generator 2300. Three partial string registers 2302, 2304, 2306 each have an index input coupled to an output of a corresponding decrementing index counter 2308, 2310, 2312. The first decrementing index counter 2308 has a preset input coupled to a register 2314 loaded with a value of s−1, the second 2310 has a preset input coupled to a register 2318 loaded with a value of to a value of r−1, the third 2312 has a preset input coupled to a register 2318 loaded with a value of r−s−1. A clock signal is coupled to each of the decrement counters 2308, 2310, 2312 to start the counters decrementing from their respective pre-load values. Each counter is initialized to the pre-load value. The pre-load values are re-loaded each time the count value is zero, creating modulo s, r and r−s counters, respectively. The outputs partial string register 2302, 2304, 2306 is coupled to string register 2326. The string register 2326 loads the bits no through $n_{2r-1}$ from each of the partial string registers 2302, 2304, 2306 and outputs the string N, which comprises the bits no through $n_{2r-1}$.

A string generated with a ζ-sequence generator will always represent a value of zero, assuming the length of the BSBS sequence is either 2r or an integer multiple of 2r. It should be noted that a BSBS sequence generated using a ζ-sequence (1, 0) generator will be identical to a BSBS sequence of the same length generated with a δ-sequence generator and representing a value of zero. This is not true for other sets of parameters. In addition, the product of a first string ζ($r_1,s_1$) and a second string ζ($r_2,s_2$) will always be equal to 0, if $r_1$ is not equal to $r_2$ or $s_1$ is not equal to $s_2$ and the length of the product of the two strings is equal to $2 \times r_1 \times r_2$, or an integer multiple thereof. Furthermore, a BSBS sequence generated using a ζ-sequence generator multiplied by a either a BSBS sequence generated using a δ-sequence generator or a ω-sequence generator will result in a product that has a value, P that is less than or equal to r of the BSBS sequence generated with a δ-sequence generator, assuming the length, T of the string is equal to, or an integer multiple of 2r. Also, the product, P of a BSBS sequence generated using a ζ-sequence generator and a BSBS sequence generated using a σ-sequence generator will have a value with a mean of 0 and a scaled standard deviation proportional to the square root of (p(1−p))/T. Lastly, a BSBS sequence generated using a ζ-sequence generator can be multiplied by a time shifted version of itself, as long as the amount of the shift is not equal to r or an integer multiple of r.

Figure 24:
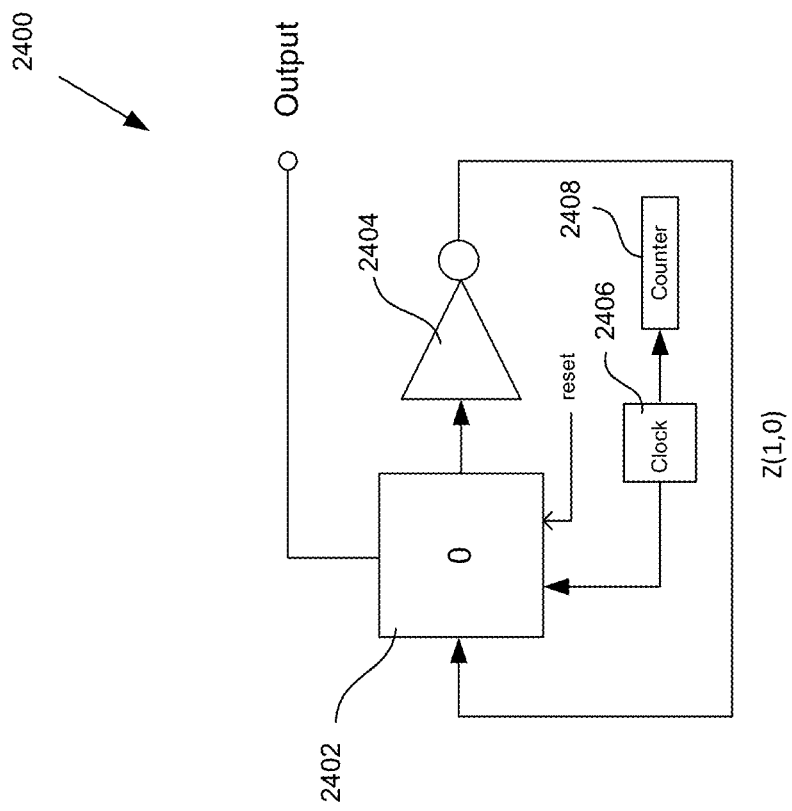
FIG. 24 is an alternative embodiment for implementing a ζ-sequence generator for generating sequences of ζ(r,s)=ζ(1,0).

FIG. 24 is an alternative embodiment for implementing a ζ-sequence generator 2400 for generating sequences of ζ(r,s)=ζ(1,0). The output of a register 2402 is coupled to the input of an inverter 2404. The output of the inverter 2404 is fed back around to the input of the register 2402. The output bits are taken from the register 2402. Initially, the register 2402 is reset to zero by a reset signal. A clock 2406 generates a clock signal applied to the register 2402 to move the signal at the input of the register to the output of the register 2402. In some embodiments, a counter 2408 is used to count the clock pulses and establish an index i that indicates the particular bit being generated (i.e., $n_i$ of the, ζ(r,s) sequence, N). As the clock signal moves the bit through the register 2402 and inverter 2404, the output will alternate between 1 and 0, generating the desired output stream. It should be noted that the "0" noted in the register of FIG. 24 does not indicate the value stored in the register, but rather the position of the register within the generator 2400, as will become clearer as the implementations shown in FIG. 25, FIG. 26, FIG. 27 and FIG. 28 are disclosed below.

Figure 25:
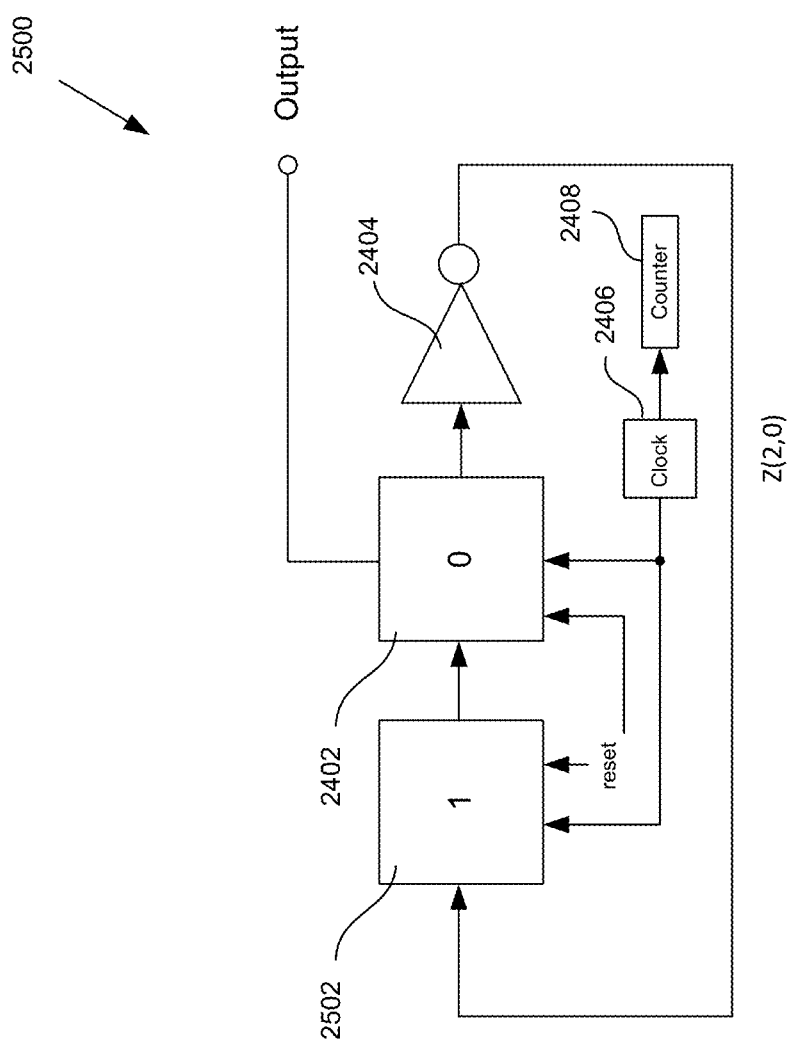
FIG. 25 is a simplified schematic of ζ(r,s)=ζ(2,0) generator.

FIG. 25 is a simplified schematic of ζ(r,s)=ζ(2,0) generator 2500. The generator 2500 comprises a circular shift register with a "zeroth" register element 2402, a first register element 2502, an inverter 2404, a clock 2406 and a counter 2408. The zero in the register element 2402 indicates that it is the zeroth element. The one in the first register element 2502 indicates that it is the first register element. Each of the register elements 2402, 2502, 2702 is reset by the reset signal and shifted by the clock signal. The generator 2500 works similar to the generator 2400, but the addition of the second register element 2502 causes the output to alternate between pairs of ones and pairs of zeros, with the first two bits, no, $n_1$, being zero followed by the next two bits, $n_2$, $n_3$ being ones, this pattern then repeating. It should be noted that while the register elements 2402, 2502 are shown to have values of 1 and 0, respectively, they are both initially reset to zero.

Figure 26:
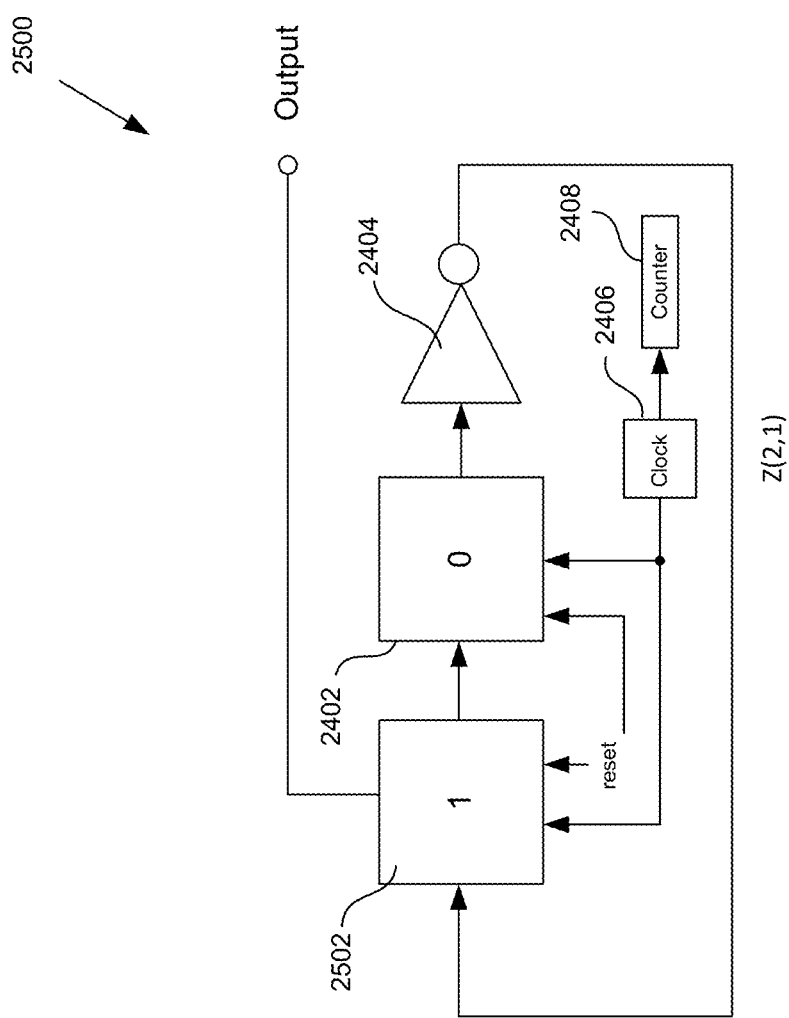
FIG. 26 is a simplified schematic of ζ(r,s)=ζ(2,1) generator.

FIG. 26 is a simplified schematic of ζ(r,s)=ζ(2,1) generator 2600. The generator 2600 comprises a circular shift a "zeroth" register element 2402, a first register element 2502, an inverter 2404, a clock 2406 and a counter 2408 just like the generator 2500 of FIG. 25. Each of the register elements 2402, 2502, 2702 is reset by the reset signal and shifted by the clock signal. The generator 2600 works the same as the generator 2500, but the output is taken from the first register element 2502, causing only the first bit that is output to be zero, there after the output alternates between pairs of ones and pairs of zeros. Accordingly, with the first bit, $n_0$ is zero, the second bit $n_1$ is one, the third bit, $n_2$, is one and the fourth bit, $n_3$ is zero. This pattern then repeats.

Figure 27:
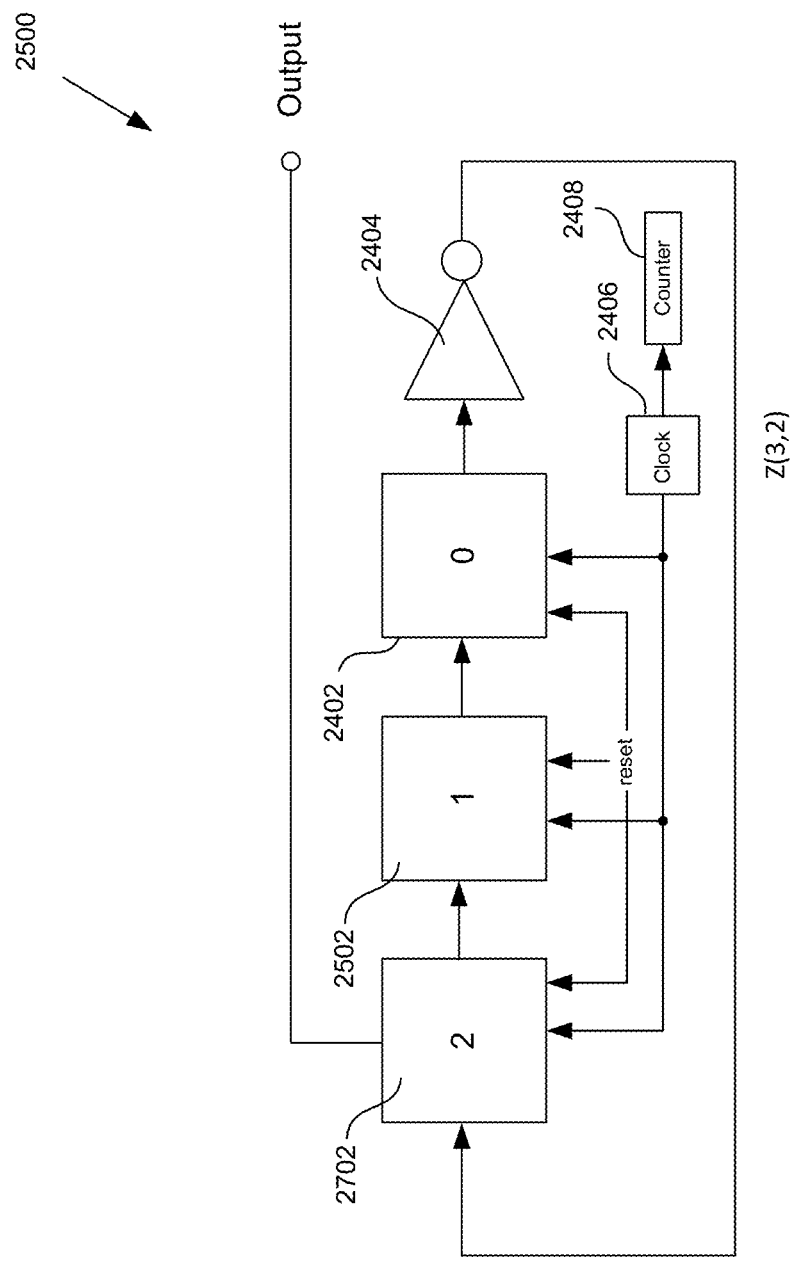
FIG. 27 is a simplified schematic of ζ(r,s)=ζ(3,2) generator.

FIG. 27 is a simplified schematic of ζ(r,s)=ζ(3,2) generator 2700. The generator 2700 comprises a circular shift register with three register elements 2402, 2502, 2702, an inverter 2404, a clock 2406 and a counter 2408. Each of the register elements 2402, 2502, 2702 is reset by the reset signal and shifted by the clock signal. The generator 2700 works similar to the other ζ(r,s) generators 2400, 2500, 2600. The output is taken from the first register element 2702, causing the first bit, no to be a zero, but each of the following three bits, $n_1$, $n_2$, $n_3$ will be ones. The desired pattern of one zero, followed by three ones, followed by 2 zeros will repeat (i.e., 011100,011100 . . . ).

Figure 28:
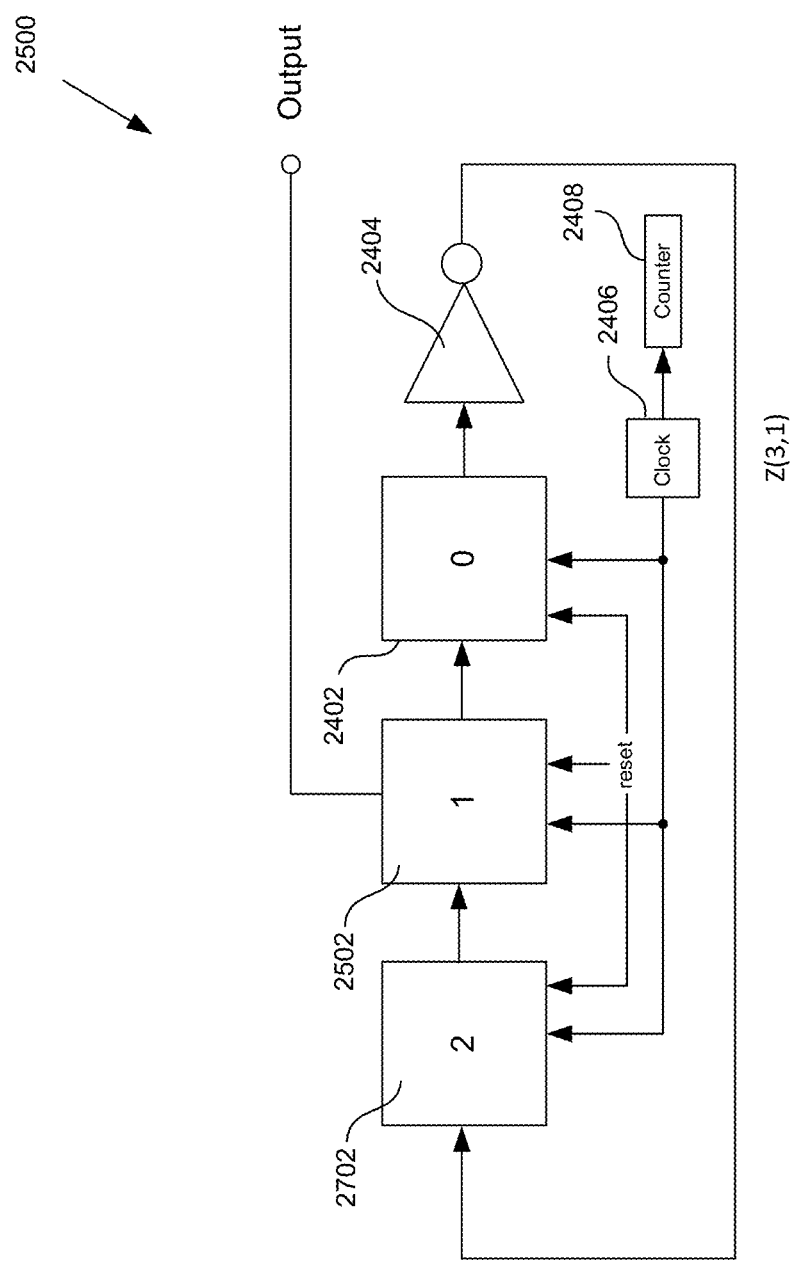
FIG. 28 is a simplified schematic of ζ(r,s)=ζ(3,1) generator.

FIG. 28 is a simplified schematic of ζ(r,s)=ζ(3,1) generator 2800. The generator 2800 comprises a circular shift register with three register elements 2402, 2502, 2702, an inverter 2404, a clock 2406 and a counter 2408. Each of the register elements 2402, 2502, 2702 is reset by the reset signal and shifted by the clock signal. The generator 2800 works the same as the ζ(r,s) generator 2700, but the output is taken from the second register element 2502, causing the first two bits, $n_0$, $n_1$ to be a zero, followed by three bits, $n_2$, $n_3$, $n_4$ will be ones and a $6^{th}$ bit $n_5$ that is a zero. The desired pattern of two zeros, followed by three ones, followed by 1 zero will repeat (i.e., 001110,001110 . . . ).

It can be seen that the implementation of ζ(r,s) generator can be generalized by noting that r register elements are provided, with the output being taken by the register element indicated by s. In the case of the generator 2800, there are r=3 register elements 2402, 2502, 2702, with the output being taken from the first register element 2502, as indicated by s=1. In a ζ(3,0) generator, the output would be taken from the zeroth register element 2402.

Yet another SBS generator that can be used in accordance with some embodiments of the disclosed method and apparatus generates a "prime"-sequence, i.e., $\sigma'_{r,s}$-sequence and $\rho'_{r,s}$-sequence. These prime-sequence generators are modifications of their underlying sequences. That is, the $\sigma'_{r,s}$ sequence is a modification of the σ-sequence. The modification is that for b=0, the BSBS sequence is generated using a ζ-sequence generator, but for all other values of b, a σ-sequence generator is used to generate the BSBS sequence. Similarly, the $\rho'_{r,s}$-sequence is generated using a ρ-sequence generator for all values of b except b=0, for which a ζ-sequence generator is used. Generating BSBS sequences using a $\rho'_{r,s}$-sequence generator or a $\sigma'_{r,s}$-sequence generator improves the behavior of the standard ρ-sequence and σ-sequence generators for b=zero by ensuring that the error for multiplication by zero is minimized.

γ-sequences

γ-sequences are a slight modification to the ρ-sequence and σ-sequence, in which a comparison values (i.e., those values that are compared to b to determine the bit value) are created by a generator function $G_L(i)$ that maps values of the index, i into the space that includes integer values in the range from $-2^{L-}$ to $2^{L-1}-1$. The generator function may be a hash function that is "random", such as an L-bit cyclic redundancy code (CRC) in which a fixed bit sequence serves as the seed and the input is the index value, i.

The γ-sequence generator operates the same way as the ρ-sequence generator described above, but for the use of the function $G_L(i)$ in place of the RNG output. A prime sequence generator for the $\gamma'_{r,s}$-sequence operates the same way as the γ-sequence generator described above, but for the use of the function GL(i) in place of the RNG output. The advantage provided by the γ-sequence generator is the fact that it does not require a linear-feedback shift register (LFSR), as is required for the PRNG that is used to generate the RNG output in the ρ-sequence generator and the σ-generator described above.

Each of the above described sequence generators can be provided as sub-blocks in a single BSBS sequence generator and selected based upon the particular characteristics of the operation to be performed on the resulting BSBS sequence and the conditions under which the string is being generated. By providing flexibility in determining which particular generator is best suited to a particular situation, the advantages of each generator can be maximized for each particular situation.

Figure 29:
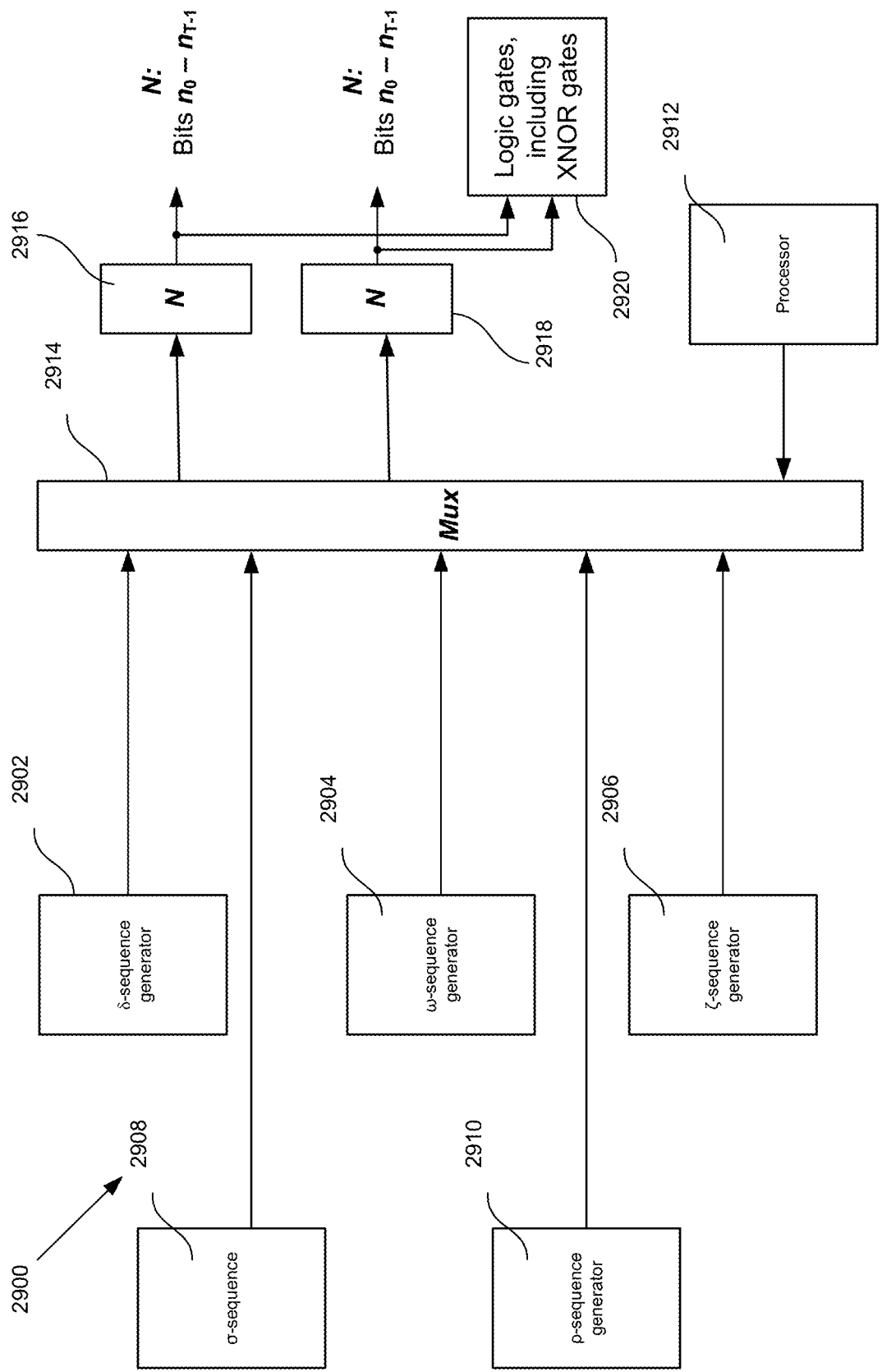
FIG. 29 is a simplified block diagram of a generator comprising a plurality of SBS generator sub-blocks generating sequences by different techniques.

FIG. 29 is a simplified block diagram of a generator comprising a plurality of SBS generator sub-blocks 2902, 2904, 2906, 2908, 2910 each sub-block generating an SBS sequence using a different technique. A processor 2912 is coupled to a multiplexer 2914 and controls the selection by multiplexer 29014 of the generator sub-block 2902, 2904, 2906, 2908, 2910 to be coupled to the input of a register 2916, 2918 in which the value of BSBS sequences generated by the generator sub-blocks 2902, 2904, 2906, 2908, 2910 are stored. In alternative embodiments, the output of each of the sub-blocks 2902, 2904, 2906, 2908, 2910 may be stored in a different register. Those registers 2916, 2918 can then be selectively coupled to a set of logic gates 2920, such as exclusive NOR (XNOR) gates that perform the multiplication of the strings output by the sub-blocks 2902, 2904, 2906, 2908, 2910.

CONCLUSION

A number of embodiments of the disclosed method and apparatus have been described. It is to be understood that various modifications may be made without departing from the spirit and scope of the disclosed method and apparatus. For example, some of the steps described above may be order independent, and thus can be performed in an order different from that described. Further, some of the steps described above may be optional. Various activities described with respect to the methods identified above can be executed in repetitive, serial, or parallel fashion. It is to be understood that the foregoing description is intended to illustrate and not to limit the scope of the any claims that are presented in later filed applications that might claim priority to this disclosure.

What is claimed is:

1. A stochastic binary string (SBS) generator, comprising:
    (a) a plurality of SBS generator sub-blocks, each sub-block generating an SBS sequence using a different technique;
    (b) a selector for selectively coupling an input value to a selected one from among the plurality of SBS generator sub-blocks; and
    (c) a processor coupled to the selector to control the selection performed by the selector.

2. The SBS generator of claim 1, wherein the plurality of SBS generator sub-blocks include at least one SBS ρ-sequence generator sub-block that generates ρ-sequence SBS sequences.

3. The SBS generator of claim 1, wherein the plurality of SBS generator sub-blocks include at least one SBS δ-sequence generator sub-block that generates δ-sequence SBS sequences.

4. The SBS generator of claim 1, wherein the plurality of SBS generator sub-blocks include at least one SBS ω-sequence generator sub-block that generates ω-sequence SBS sequences.

5. The SBS generator of claim 1, wherein:
    (a) the plurality of SBS generator sub-blocks includes a first SBS ρ-sequence generator sub-block generates SBS ρ-sequence strings;
    (b) the plurality of SBS generator sub-blocks includes a second SBS δ-sequence generator sub-block that generates SBS δ-sequence strings;
    (c) the processor selects from among the plurality of SBS generator sub-blocks, the first SBS generator sub-block to generate a first SBS sequence; and
    (d) the processor selects from among the plurality of SBS generator sub-blocks, the second SBS generator sub-block to generate a second SBS sequence to be multiplied with the first SBS sequence.

6. The SBS generator of claim 5, further including at least one exclusive nor (XNOR) gate having a first input coupled to the first SBS generator sub-block to receive the first SBS sequence and having a second input coupled to the second SBS generator sub-block to receive the second SBS sequence, the output of the XNOR gate being the product of the first SBS sequence and the second SBS sequence.

7. The SBS generator of claim 1, wherein the plurality of SBS generator sub-blocks include at least one SBS generator sub-block that generates SBS sequences using a σ-sequence method.

8. The SBS generator of claim 7, wherein the plurality of SBS generator sub-blocks include at least one SBS generator sub-block that generates SBS sequences using a δ-sequence method.

9. The SBS generator of claim 7, wherein the plurality of SBS generator sub-blocks include at least one SBS generator sub-block that generates SBS sequences using a ω-sequence method.

10. The SBS generator of claim 7, wherein:
 (a) the plurality of SBS generator sub-blocks includes a first SBS generator sub-block that generates SBS sequences using a σ-sequence method;
 (b) the plurality of SBS generator sub-blocks includes a second SBS generator sub-block that generates SBS sequences using a δ-sequence method;
 (c) the processor selects from among the plurality of SBS generator sub-block, the first SBS generator sub-block to generate a first SBS sequence; and
 (d) the processor selects from among the plurality of SBS generator sub-blocks, the second SBS generator sub-block to generate a second SBS sequence to be multiplied with the first SBS sequence.

11. The SBS generator of claim 10, further including at least one exclusive nor (XNOR) gate having a first input coupled to the first SBS generator sub-block to receive the first SBS sequence and having a second input coupled to the second SBS generator sub-block to receive the second SBS sequence, the output of the XNOR gate being the product of the first SBS sequence and the second SBS sequence.

12. The SBS generator of claim 1, wherein the plurality of SBS generator sub-blocks include at a first SBS generator sub-block, wherein the first SBS generator sub-block generates SBS sequences using ζ-sequence method.

13. The SBS generator of claim 12, wherein the processor selects from among the plurality of SBS generator sub-blocks the first SBS generator sub-block when an SBS sequence generated by one of the other SBS generator sub-blocks is to be multiplied by zero and wherein the first SBS generator outputs an SBS sequence of zero.

* * * * *